US011196369B2

(12) United States Patent
Alla et al.

(10) Patent No.: US 11,196,369 B2
(45) Date of Patent: Dec. 7, 2021

(54) GENERATOR LOSS-OF-FIELD PROTECTION

(71) Applicant: Schweitzer Engineering Laboratories, Inc., Pullman, WA (US)

(72) Inventors: Matchyaraju Alla, Pullman, WA (US); Armando Guzman-Casillas, Pullman, WA (US); Dale S. Finney, Little Bras D'or (CA); Normann Fischer, Colfax, WA (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 15 days.

(21) Appl. No.: 16/425,763

(22) Filed: May 29, 2019

(65) Prior Publication Data

US 2020/0076338 A1 Mar. 5, 2020

Related U.S. Application Data

(60) Provisional application No. 62/725,907, filed on Aug. 31, 2018.

(51) Int. Cl.
*H02P 9/00* (2006.01)
*G01R 31/34* (2020.01)
(Continued)

(52) U.S. Cl.
CPC ............ *H02P 9/006* (2013.01); *G01R 31/343* (2013.01); *H02H 7/065* (2013.01); *H02P 29/40* (2016.02)

(58) Field of Classification Search
CPC .......... H02H 7/00; G01R 31/00; G01R 25/00; H02P 9/00; H02P 11/00; H02P 13/00
See application file for complete search history.

(56) References Cited

U.S. PATENT DOCUMENTS 4,029,951 A * 6/1977 Berry ..................... F01D 19/02
700/289
4,148,087 A 4/1979 Phadke
(Continued)

FOREIGN PATENT DOCUMENTS

WO 239642 5/2002

OTHER PUBLICATIONS

Ramon Sandoval, Armando Guzman, Hector Altuve, "Dynamic Simulations Help Improve Generator Protection" 33rd Annual Western Protective Relay Conference, Oct. 2006. (Year: 2006).*
(Continued)

*Primary Examiner* — Said Bouziane
(74) *Attorney, Agent, or Firm* — Justin K. Flanagan

(57) ABSTRACT

Protection devices prevent damage to synchronous generators during loss-of-field events. In various embodiments, a first protective element is associated with a first protection zone to protect a generator from a loss-of-field event at full load. A second protective element is associated with a second protection zone to prevent thermal overload during underexcited operation of the generator and to protect from loss-of-filed at light load. A third protective element associated with a third protection zone limits operation of the generator within the generator's specific steady-state stability limits. A fourth protective element is associated with a fourth protection zone to provide an alarm prior to operation of the second protective element. In various embodiments, characteristics and limits of each of the protective elements are defined in the same plane (specifically, the P-Q plane) to simplify settings and allow for visualization of the element characteristics and the generator capability curve at one or more temperatures or cooling capacities.

19 Claims, 17 Drawing Sheets

(51) Int. Cl.
*H02P 29/40* (2016.01)
*H02H 7/06* (2006.01)

(56) References Cited

U.S. PATENT DOCUMENTS

| | | | |
|---|---|---|---|
| 4,245,182 A * | 1/1981 | Aotsu | H02P 9/30 |
| | | | 322/20 |
| 5,264,778 A | 11/1993 | Kimmel | |
| 5,519,300 A | 5/1996 | Leon | |
| 5,581,470 A | 12/1996 | Pawloski | |
| 5,592,393 A | 1/1997 | Yalla | |
| 5,805,395 A | 9/1998 | Hu | |
| 6,294,898 B2 | 9/2001 | Lawson | |
| 6,492,801 B1 | 12/2002 | Sims | |
| 6,525,504 B1 | 2/2003 | Nygren | |
| 6,794,879 B2 | 9/2004 | Lawson | |
| 6,839,207 B2 | 1/2005 | Folliot | |
| 6,924,565 B2 | 8/2005 | Wilkins | |
| 6,924,628 B2 | 8/2005 | Thompson | |
| 6,975,946 B2 | 12/2005 | Al-Hamrani | |
| 7,006,935 B2 | 2/2006 | Seki | |
| 7,498,818 B2 | 3/2009 | Benmouyal | |
| 7,570,469 B2 | 8/2009 | Guzman-Casillas | |
| 7,710,693 B2 | 5/2010 | Guzman-Casillas | |
| 7,804,303 B2 | 9/2010 | Benmouyal | |
| 7,930,117 B2 | 4/2011 | Guzman-Casillas | |
| 2002/0128759 A1 | 9/2002 | Sodoski | |
| 2005/0033481 A1 | 2/2005 | Budhraja | |
| 2008/0074810 A1 * | 3/2008 | Guzman-Casillas | H02P 9/006 |
| | | | 361/20 |

OTHER PUBLICATIONS

J. K. Park et al., "A study on the underexcitation limiter performance in Korean 154kV transmission system," 13th International Conference on Development in Power System Protection 2016 (DPSP), 2016, pp. 1-6, (Year: 2016).*

Ramon Sandoval, Armando Guzman, Hector Altuve, "Dynamic Simulations Help Improve Generator Protection" 33rd Annual Western Protective Relay Conference, Oct. 2006.

John Berdy, "Loss of Excitation Protection for Modern Synchronous Generators" IEEE Transactions on Power Apparatus and Systems, vol. PAS-94, No. 5, Sep./Oct. 1975.

Hans-Joachim Herrmann, Diego Gao, "Underexcitation Protection Based on Admittance Measurement—Excellent Adaptation on Generator Capability Curves" Nov. 30, 2006.

C.R. Mason "A New Loss-of-Excitation Relay for Synchronous Generators" AIEE Transactions, vol. 68, Jul. 1949.

R.L. Tremaine, J.L. Blackburn "Loss-of-Field Protection for Synchronous Machines" Aug. 1954.

* cited by examiner

GENERATOR LOSS-OF-FIELD PROTECTION

RELATED APPLICATIONS

This application claims priority under 35 U.S.C. § 119 to U.S. Provisional Patent Application No. 62/725,907 filed on Aug. 31, 2018, titled "Generator Loss-Of-Field Protection," which application is hereby incorporated by reference in its entirety.

TECHNICAL FIELD

This disclosure relates to electric power generators. More specifically, this application relates to loss-of-field protection in electric power generators.

BRIEF DESCRIPTION OF THE DRAWINGS

The written disclosure herein describes illustrative embodiments that are nonlimiting and non-exhaustive. Reference is made to certain of such illustrative embodiments that are depicted in the figures described below.

DETAILED DESCRIPTION

Figure 1A:
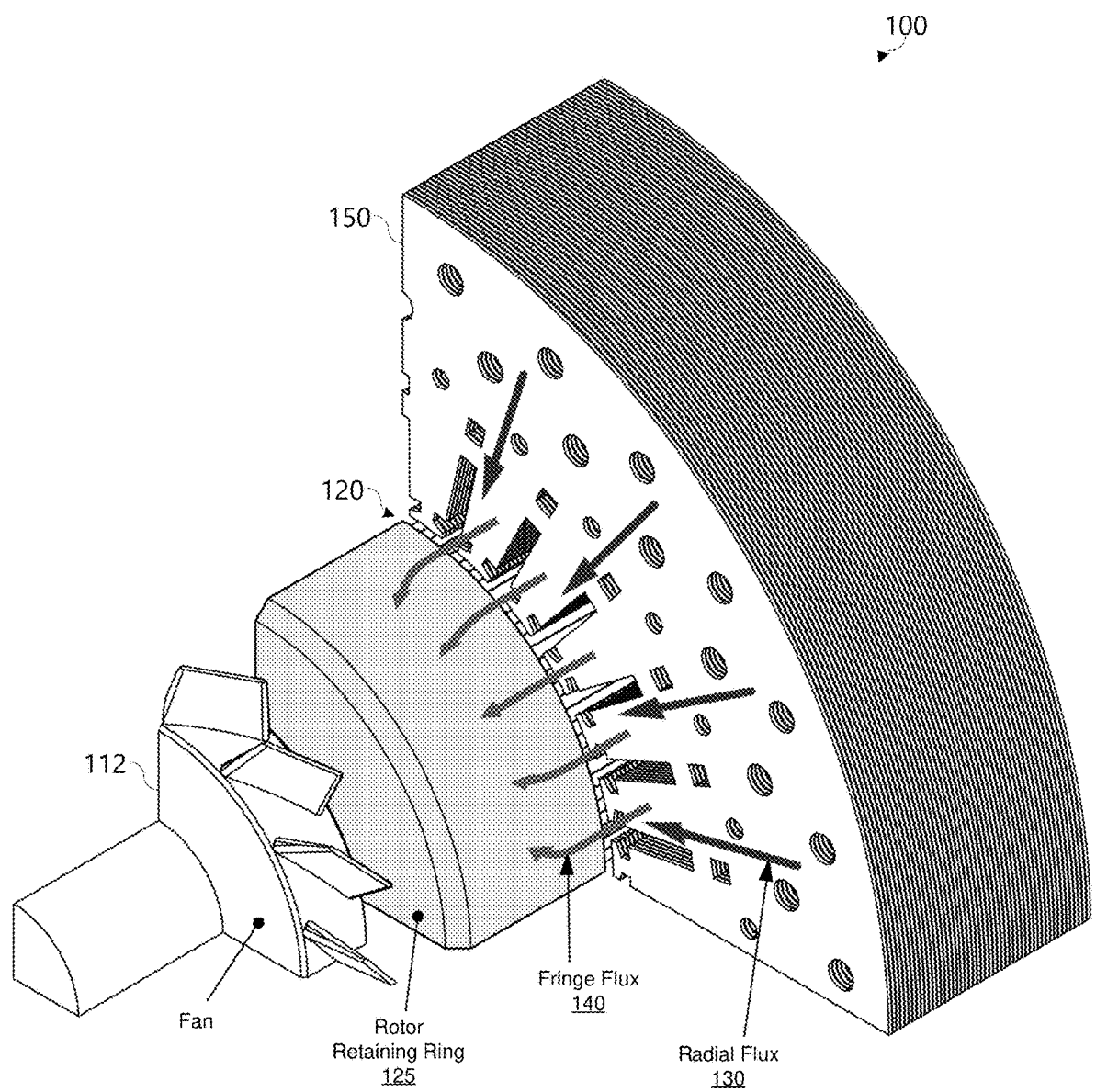
FIG. 1A illustrates a cut-away view of a generator with a cylindrical rotor showing the radial flux and fringe flux.

This disclosure presents an improvement to generator loss-of-field protection. Traditional loss-of-field protection relies upon a comparison of a generator operating point with a characteristic defined in the impedance or admittance plane. It has been observed, however, that under certain conditions, the operating point of the generator may exit the capability curve and traditional loss-of-field protection do not detect these operating conditions. That is, these operating conditions could damage the generator. The following presents an improvement to the traditional generator loss-of-field technology using a generator capability curve replica with multiple zones of protection that provide better generator protection and improved coordination with the underexcitation and stability limits.

Generator loss-of-field refers to insufficient excitation that causes the generator to operate out of a defined generator capability curve. For example, loss of field can occur because of an open or short circuit in the field circuit, an excitation failure, operational errors, loss of auxiliary power supply services, or other errors. Loss-of-field conditions, including both partial loss-of-field conditions and complete loss-of-field conditions, can damage components of a generator. Generator protection systems may act to quickly disconnect the generator during loss-of-field conditions to minimize stress to generator components and maintain power system stability. A generator protection system may implement a protection scheme that coordinates various scheme elements and an underexcitation limiter.

Reduction in the field current within a synchronous generator can weaken the magnetic field coupling between the stator and the rotor and lead to a loss of synchronism. Asynchronous operation results in "slips" or "pole slipping" between the stator and the rotor to maintain the magnetic field of the generator. Pole slipping induces damaging currents into various parts of the generator. For example, high currents due to pole slips can damage the amortisseur (damper) windings of the rotor. Pole slips can also induce high voltages that can damage field winding insulation. Furthermore, a generator slipping poles in asynchronous operation can absorb significantly more reactive power than its rated megavolt-amperes (MVA) and overload the stator.

This disclosure outlines the effects of loss of field on a synchronous generator and protection systems designed to maintain generator operation within its generator capability curve. The disclosure further outlines the effects of cooling and cooling capacity on the generator capability curve, as well as the effects of the terminal voltage and operation within the underexcited region of the generator capability curve. Protection systems utilizing underexcitation elements and protective elements maintaining generator operation within the dynamic stability limits are further described.

Variations of existing loss-of-field protection schemes are described in conjunction with FIGS. 1-10, including single and dual impedance-based protection schemes, single and dual admittance-based protection schemes, and/or combinations thereof. Finally, various embodiments of new approaches for loss-of-field protection using four protection zones defined and visualized in the P-Q plane are described in conjunction with FIGS. 11-15 and, in some instances, utilize elements described in conjunction with FIGS. 1-10. U.S. Provisional Patent Application 62/725,907, previously incorporated herein by reference in its entirety, provides additional test and simulation results that further demonstrate the performance of the four-zone, P-Q plane loss-of-field protection system.

The embodiments of this disclosure can be further understood by reference to the drawings, wherein like parts are designated by like numerals throughout. The components of the disclosed embodiments, as generally described and illustrated in the figures herein, could be arranged and designed in a wide variety of different configurations. Thus, the following description of the embodiments of the systems and methods of the disclosure is not intended to limit the scope of the disclosure, as claimed, but is merely representative of possible embodiments.

The phrases "connected to" and "in communication with" refer to any form of interaction between two or more components, including mechanical, electrical, magnetic, and electromagnetic interaction. Two components may be connected to each other, even though they are not in direct contact with each other, and even though there may be intermediary devices between the two components.

One or more of the described systems and methods may be implemented, monitored, and/or controlled by an intelligent electronic device (IED). As used herein, the term "IED" may refer to any microprocessor-based device that monitors, controls, automates, and/or protects monitored equipment within a system. Such devices may include, for example, remote terminal units, differential relays, distance relays, directional relays, feeder relays, overcurrent relays, voltage regulator controls, voltage relays, breaker failure relays, generator relays, motor relays, automation controllers, bay controllers, meters, recloser controls, communications processors, computing platforms, programmable logic controllers (PLCs), programmable automation controllers, input and output modules, motor drives, and the like. An IED may include systems to monitor electric signals sampled from the electric power fed to an electric motor and/or may include portions of a sensor system to monitor a location of a shaft (rotor) within a motor (e.g., relative to the stator).

IEDs may be connected to a network, and communication on the network may be facilitated by network devices including, but not limited to, multiplexers, routers, hubs, gateways, firewalls, and switches. Furthermore, networking and communication devices may be incorporated in an IED or be in communication with an IED. The term "IED" may be used interchangeably to describe an individual IED or a system comprising multiple IEDs.

Aspects of certain embodiments described herein may be implemented as software modules or components. As used herein, a software module or component may include any type of computer instruction or computer-executable code located within or on a computer-readable storage medium. A software module may, for instance, comprise one or more physical or logical blocks of computer instructions, which may be organized as a routine, program, object, component, data structure, etc. that performs one or more tasks or implements particular abstract data types.

A particular software module may comprise disparate instructions stored in different locations of a computer-readable storage medium, which together implement the described functionality of the module. Indeed, a module may comprise a single instruction or many instructions and may be distributed over several different code segments, among different programs, and across several computer-readable storage media.

Some embodiments may be practiced in a distributed computing environment where tasks are performed by a remote processing device linked through a communications network. In a distributed computing environment, software modules may be located in local and/or remote computer-readable storage media. In addition, data being tied or rendered together in a database record may be resident in the same computer-readable storage medium, or across several computer-readable storage media, and may be linked together in fields of a record in a database across a network. In alternative embodiments, hardware and firmware may be utilized instead of software. For example, application-specific control circuitry may be utilized to increase speed, efficiency, serviceability, and/or reduce maintenance costs.

Some of the infrastructure that can be used with embodiments disclosed herein is already available, such as general-purpose computers, computer programming tools and techniques, digital storage media, and communications networks. A computer may include a processor, such as a microprocessor, microcontroller, logic circuitry, or the like. The processor may include a special-purpose processing device, such as an ASIC, PAL, PLA, PLD, CPLD, Field Programmable Gate Array (FPGA), or other customized or programmable device. The computer may also include a computer-readable storage device, such as non-volatile memory, static RAM, dynamic RAM, ROM, CD-ROM, disk, tape, magnetic, optical, flash memory, or other computer-readable storage media.

FIG. 1A illustrates a cut-away view of one embodiment of a portion of a generator 100 with a cylindrical rotor 120 showing the radial flux 130 and fringe flux 140. The fringe flux 140 linking the stator core 150 rotates at the synchronous frequency of the generator 100 (e.g., 50 or 60 Hertz). With respect to the rotor 120, however, the fringe flux 140 is stationary. Accordingly, the fringe flux 140 induces eddy currents and losses in the stator-end-core laminations.

The stator core 150 is designed to carry radial flux 130 parallel to the stator-core laminations. The stator core 150 may comprise thinly laminated sheets of cold-rolled, grain-orientated silicon steel to reduce eddy currents in the stator core 150. However, when the rotor retaining ring 125 comes out of saturation, the flow of fringe flux 140 between the stator-end-core regions and the rotor retaining rings 125 increases.

This increase in the flow of fringe flux 140 at the stator-end-core regions 150 occurs perpendicularly (axially) to the laminations of the stator 150. The fringe flux 140 linking the rotor 120 to the stator core 150 rotates at the synchronous frequency of the generator (e.g., 50 or 60 Hz) but, with respect to the rotor 120, the fringe flux 140 is stationary (frequency=0).

Figure 1B:
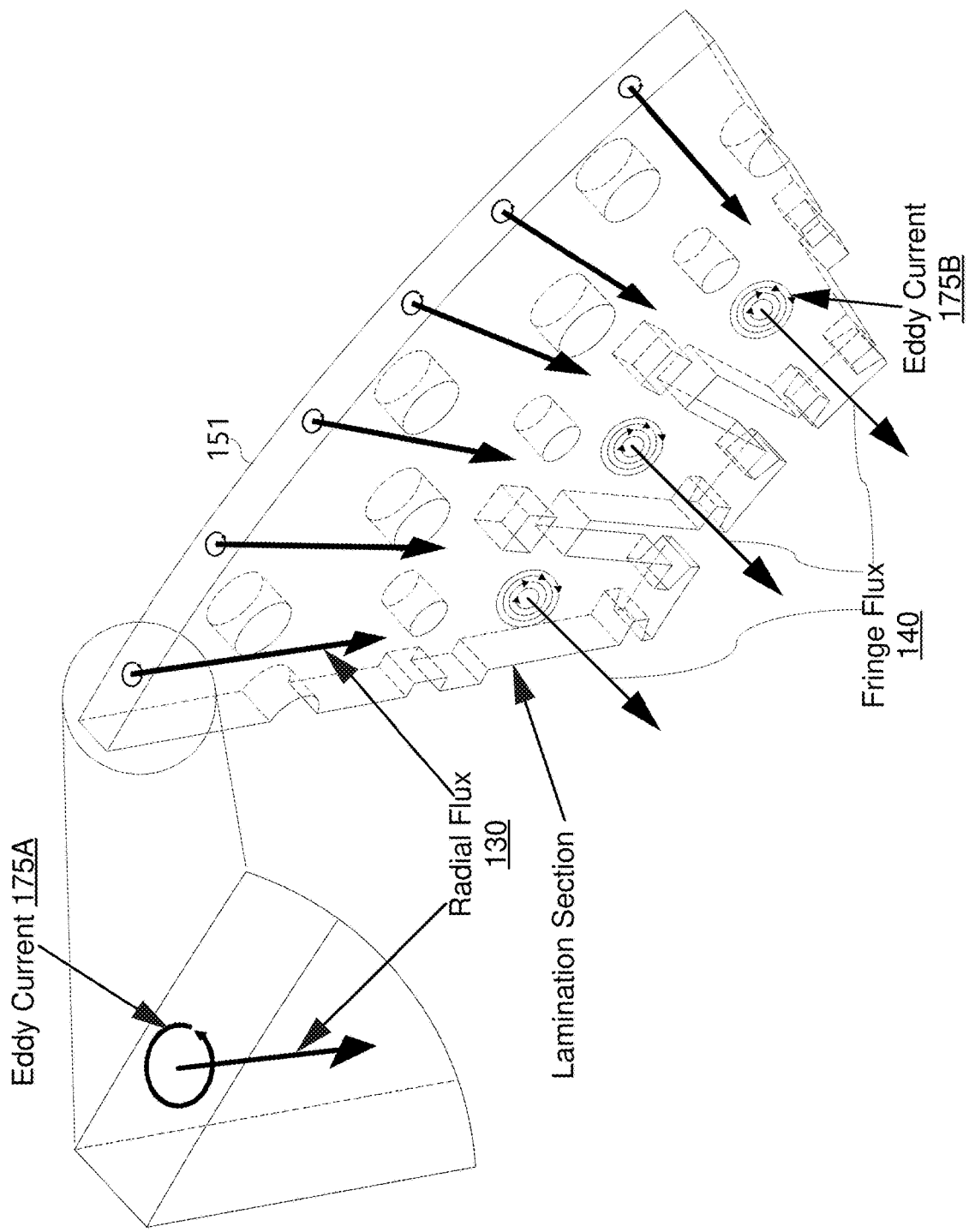
FIG. 1B illustrates eddy currents associated with fringe flux.

FIG. 1B illustrates eddy currents 175A associated with the radial flux and eddy currents 175B associated with the fringe flux 140, according to one embodiment. FIG. 1B illustrates a single lamination 151 of the stator (150, FIG. 1A) with a relatively large surface area normal to the fringe flux 140. Losses from eddy currents 175B will be far greater than those produced by the radial flux 130 that flows parallel to the stator lamination 151. The heat generated by the fringe flux 140 can cause temperatures high enough to melt the stator-core lamination insulation 151 within minutes—leading to shorted laminations.

The amount of reactive power that a cylindrical-rotor synchronous generator can absorb is based in large part on the heat that the stator-end-core region (150, FIG. 1A) can dissipate before being damaged. Hence, the reactive power lower limit of the generator capability curve for cylindrical-rotor synchronous generators is determined by the stator end-core heating limit and not by the stator current heating limit.

The reactive power flow in the generator maintains the magnetic field of the generator during a loss-of-field event.

The reactive power comes from the power system and can jeopardize the stability of the power system. For example, loss of synchronism can cause large pulsations in voltage and current that can further jeopardize the power system and negatively impact stability. A protection scheme can be employed to ensure that the generator is operated within the generator capability curve. The generator capability curve is defined by the operating limits of the generator.

Figure 2:
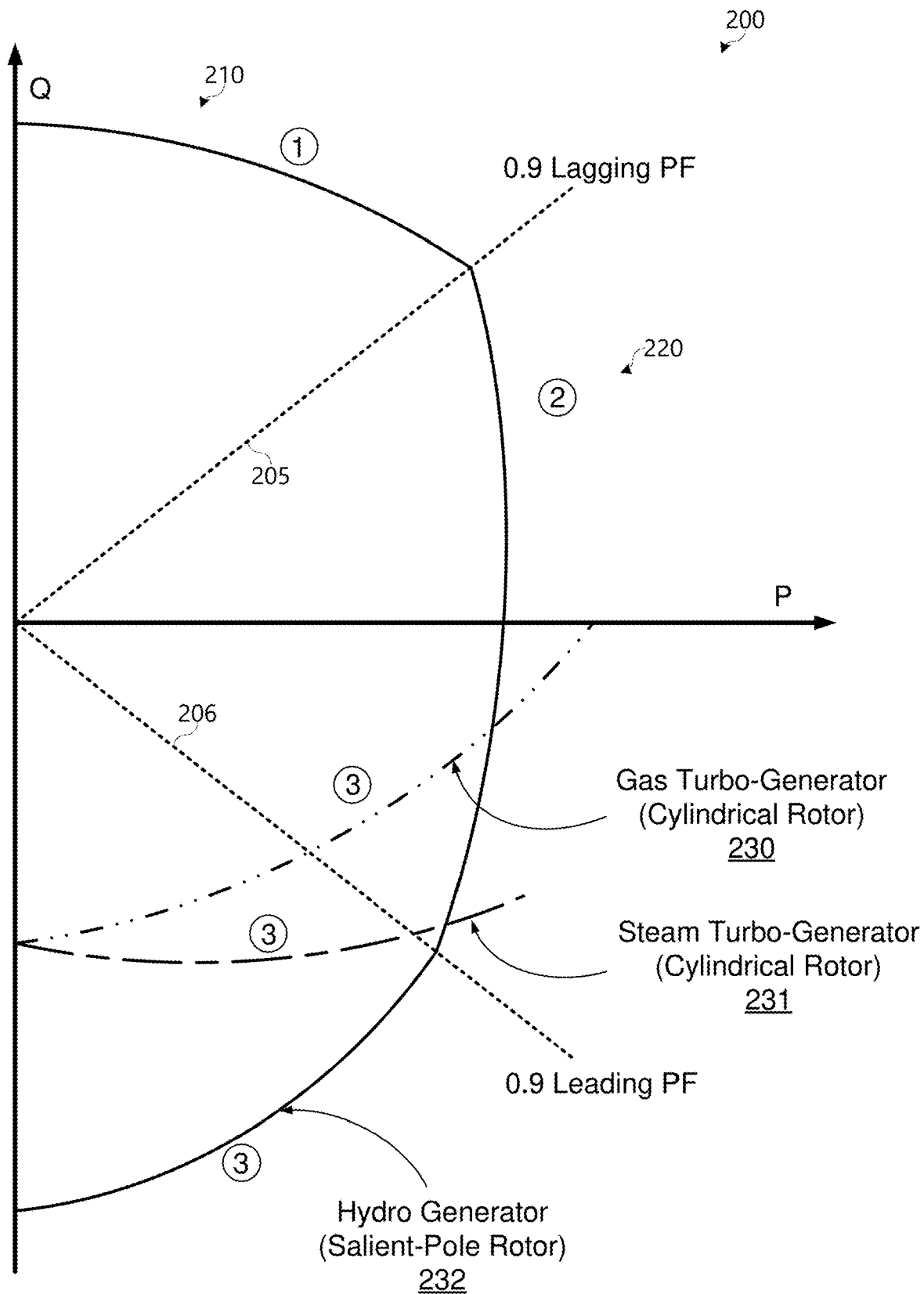
FIG. 2 illustrates a generator capability curve for a generator.

FIG. 2. illustrates an example of a generator capability curve 200 plotted in the P-Q plane, according to one embodiment. The illustrated generator capability curve 200 is based, at least in part, on the ampere rating (thermal limit) of the field windings. Segment 1 210 of the generator capability curve 200 corresponds to the ampere rating of the field winding as a limitation on the reactive power overexcitation. Segment 2 220 of the generator capability curve 200 corresponds to the thermal limit of the stator windings that limits the active power output around the unity power factor. Dashed line 205 represents operation of the generator with a 0.9 lagging power factor. Dashed line 206 represents operation of the generator with a 0.9 leading power factor.

Three possible options for the segment 3 underexcited region are illustrated depending on the type of generator in use. A first segment 3 230 is shown for a gas turbo-generator with a cylindrical rotor. A second segment 3 231 is shown for a steam turbo-generator with a cylindrical rotor. A third segment 3 232 is shown for a hydro generator with a salient-pole rotor. The underexcited limits of the generator shown by the first and second segment 3 sections 230 and 231 correspond to the stator end-core heating limit for cylindrical-rotor generators. In contrast, the third segment 3 section 232 may correspond to the ampere rating of the stator winding of a salient-pole generator and/or a more restrictive, steady-state stability limit.

Figure 3:
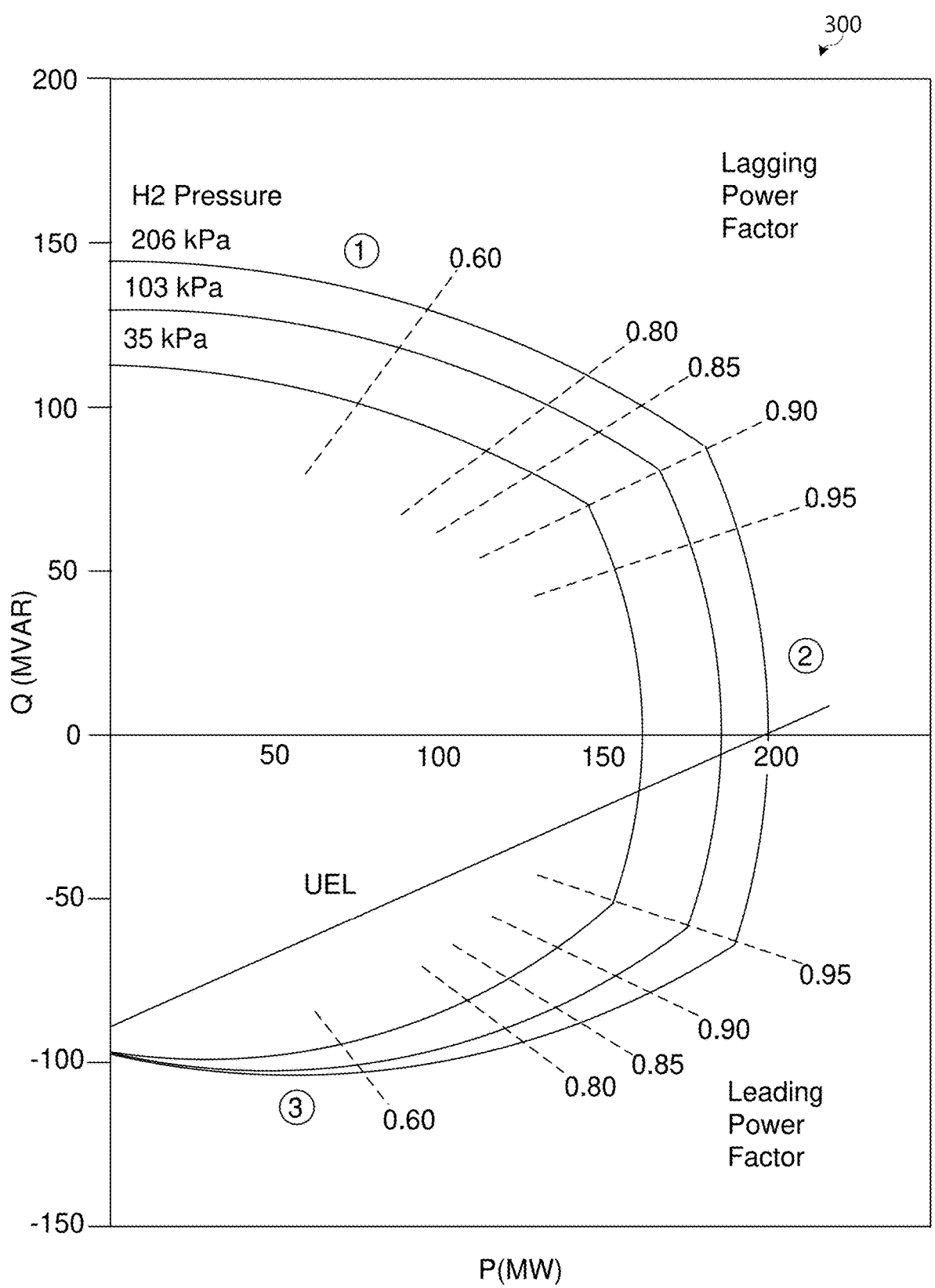
FIG. 3 illustrates a generator capability curve for a hydrogen-cooled steam-turbine generator for various hydrogen pressures.

FIG. 3 illustrates multiple generator capability curves 300 of an example hydrogen-cooled steam-turbine generator at various hydrogen pressures. As illustrated, synchronous generators can have multiple ratings depending on their cooling, such as coolant temperature (e.g., ambient air) or coolant pressure (e.g., hydrogen). Generator manufacturers specify generator capability curves based on coolant temperatures and/or pressures above and below the generator's temperature and pressure ratings. Generally, higher coolant pressures allow for expanded operating ranges, while lower coolant pressures result in decreased operating ranges.

Figure 4:
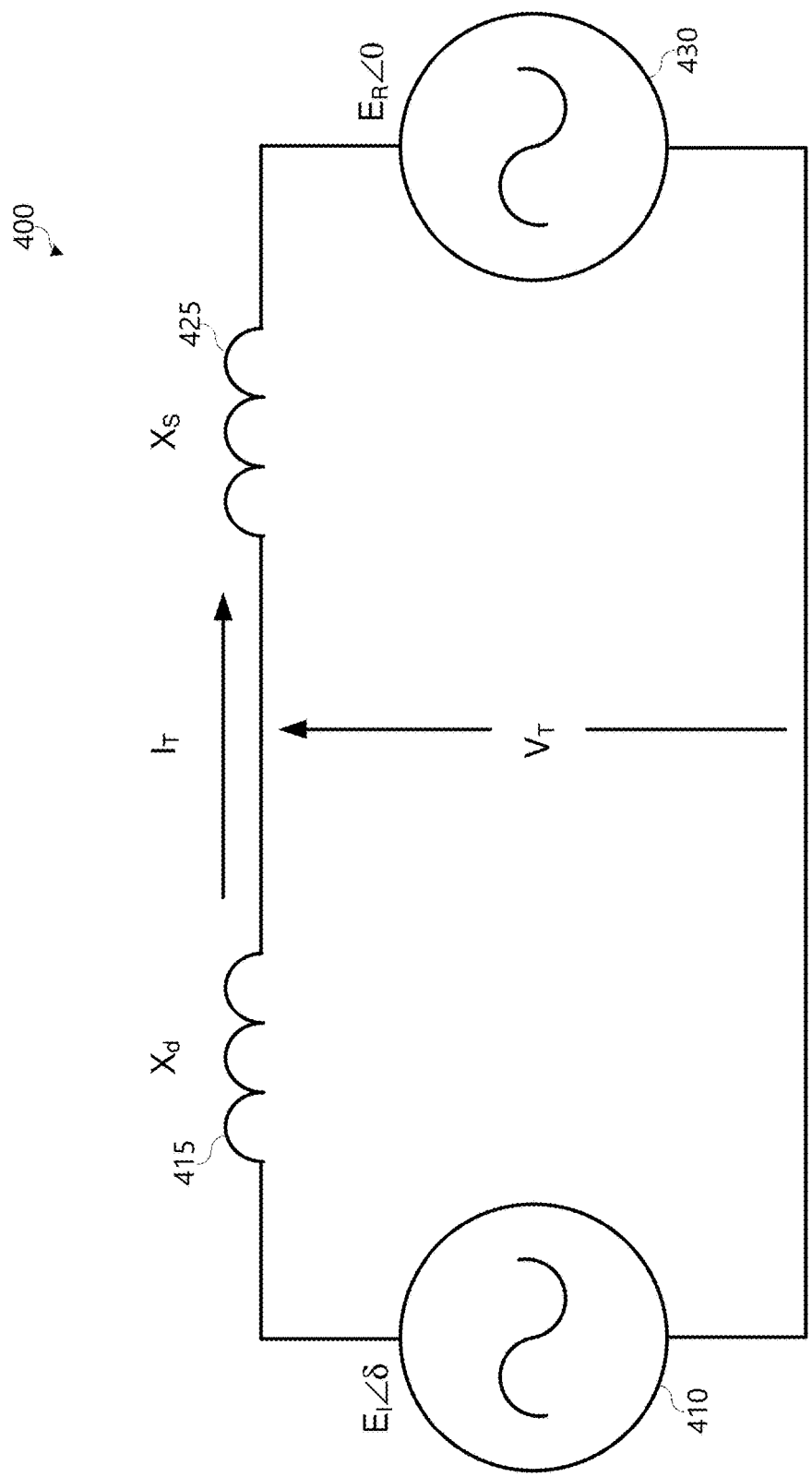
FIG. 4 illustrates a simplified equivalent circuit of a synchronous generator connected to a power system.

FIG. 4 illustrates a simplified equivalent circuit 400 of a synchronous generator connected to a power system, according to one embodiment. The equivalent internal voltage 410 is the sum of the terminal voltage, $V_T$, and the voltage drop across the internal impedance element $X_d$ 415. The equivalent internal voltage 410 is directly proportional to the field current of the synchronous generator. The system impedance $X_S$ 425 is shown in connection with the remote source voltage 430. Decreases in the field current translate to increased end-core heating, as previously described. Generator capability curves based on a terminal voltage, $V_T=1$ per-unit, can be used to estimate generator capability curves at other terminal voltage magnitudes.

For example, the reactive power absorption capability of cylindrical-rotor generators decreases with increased terminal voltage, $V_T$. Equation 1 below uses generator-specific thermal constants $k_1$ (e.g., provided by the manufacturer or determined through testing) to calculate the center of a reactive power absorption capability curve on the P-Q plane.

$$\text{Center}(P, Q) = \left(0, \frac{k_1 * V_T^2}{X_d}\right) \quad \text{Equation 1}$$

Equation 2 uses another generator-specific thermal constant $k_2$ to determine the radius of the reactive power absorption capability curve on the P-Q plane.

$$\text{Radius} = \frac{k_2 * V_T}{X_d} \quad \text{Equation 2}$$

As previously noted, loss of field may result in a loss of generator stability. The underexcitation limiter and the steady-state stability limit may be coordinated with loss-of-field protection elements to ensure further system stability. The steady-state stability limit can be determined using a power-angle equation based on the remote source voltage, $E_R$, the load angle, δ, and the system impedance, $X_S$, as illustrated in Equation 3 below.

$$P = \frac{|E_1| * |E_R|\sin\delta}{X_d + X_S} \quad \text{Equation 3}$$

When the automatic voltage regulator is in manual mode, the internal voltage 410 is fixed. With a constant internal voltage $E_I$ 410 and a constant remote source voltage $E_R$ 430, increases in the power, P, are accompanied by increases in the load angle, δ, per Equation 3. At δ=90°, the right side of Equation 3 is at maximum. Any additional power increase results in a loss of steady-state stability. Accordingly, a manually assigned steady-state stability limit may be based primarily on the system impedance $X_S$ 425.

The steady-state stability limit in the P-Q plane varies with the square of the terminal voltage, $V_T$. The steady-state stability limit of a generator may be dynamically adjusted when the generator is connected to a power system in which the system impedance $X_S$ 425 changes. An automatic voltage regulator and a power system stabilizer may improve the stability limits of a generator.

In some embodiments, the electrical torque of the generator is resolved into as two components, including a synchronizing component that is proportional to a deviation in δ and a damping component that is proportional to a deviation in speed. With a constant internal voltage 410, there is no damping torque limit, and thus the synchronizing torque is the only limit. Insufficient synchronizing torque results in a loss of steady-state stability, while insufficient damping torque results in dynamic instability. These instabilities result in a growing (undamped) oscillation over time.

Figure 5:
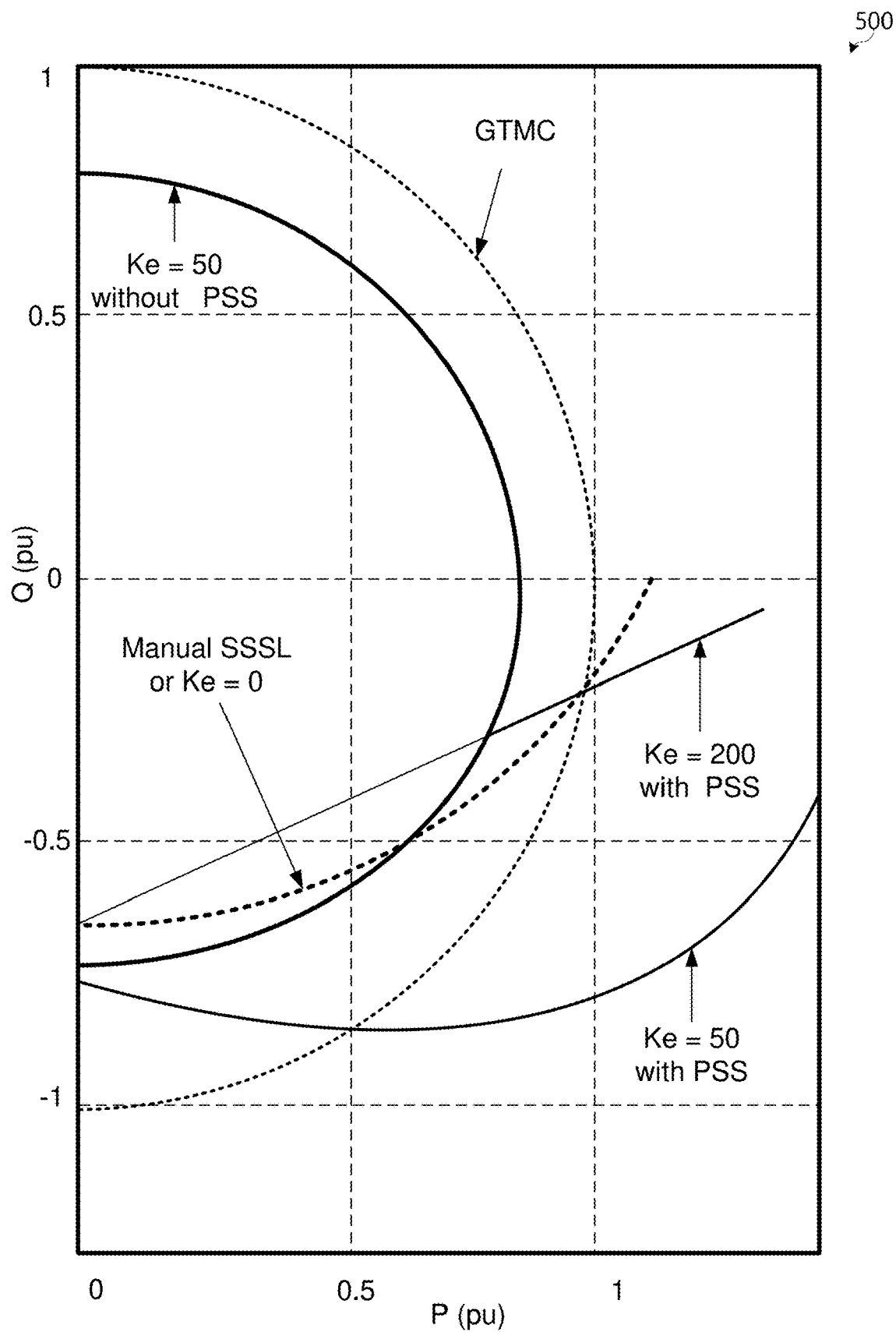
FIG. 5 illustrates the impact of a power system stabilizer on a generator stability limit.

FIG. 5 illustrates a graph 500 of the impact of a power system stabilizer on generator stability limits, according to one embodiment. In the illustrated embodiment, eigenvalues are used to plot limits to maintain dynamic stability in the P-Q plane for various values of automatic voltage regulator gain (Ke). Following an external fault clearance, a synchronous generator can positively contribute to transient stability by having the highest excitation voltage possible in the shortest possible time. In some embodiments, high-speed exciters may provide such voltages for short amounts of time. Establishing generator capability curves that allow for the highest possible Ke allows for the use of such high-speed exciters. However, high Ke decreases damping torque, which increases the risk that the generator will experience oscillations. As illustrated in FIG. 5, this approach to determining generator capability curves may produce a dynamic limit with high Ke that is more restrictive than the steady-state stability limit.

To address the reduction in damping torque, high-speed exciters may be equipped with power system stabilizers. The effect of a power system stabilizer is to artificially increase the damping torque to improve the dynamic stability limit. As illustrated, when Ke=50 (without power system stabilizer), the dynamic stability limit is entirely within the generator theoretical maximum capability curve, which is shown as a stator current, 1 per-unit circle. With the addition of the power system stabilizer, the generator may operate at its full capacity. For example, with Ke set to 200, the generator can operate without compromise within the generator theoretical maximum capability curve. The plot in the P-Q plane allows for a visualization of the control systems and effects of protection parameters. Dynamic simulations may also be used to coordinate protection and control system responses.

In some embodiments, underexcitation limiters may be used to prevent operation of the generator beyond the steady-state stability limit or stator end-core heating limit. In such embodiments, the underexcitation limiter may be set according to the steady-state stability limit or the stator end-core heating limit, whichever is more restrictive. If the stator end-core heating limit is the most restrictive curve, the underexcitation limiter may be set to follow this characteristic with minimal margin (e.g., 5-10 percent of the rated MVA). As previously noted, the protection system may coordinate the loss-of-field protection elements and underexcitation limiter(s) to ensure that the loss-of-field element allows the underexcitation limiter(s) sufficient time to respond to underexcited conditions.

Generator and automatic voltage regulators may include data identifying the generator capability curve and underexcitation limiter characteristics in the P-Q plane. Steady-state stability limit characteristics may be defined in the impedance plane since the steady-state limit characteristics depend on the generator and power system impedances and are voltage invariant.

According to various embodiments, the generator capability curve, underexcitation limiter characteristics, and steady-state stability limit characteristics may be set and analyzed in a common plane. Loss-of-field elements may be programmed and analyzed based on the common plane analysis of the various generator characteristics. In one embodiment, the generator capability curve characteristics, the underexcitation limiter characteristics, and the steady-state stability limit characteristics are concurrently represented in the P-Q plane (e.g., graphically or through mathematical expression) through use of mathematical transformations between planes.

For example, to obtain the generator capability curve per-unit characteristics in the P-Q plane, the specified values are divided by the generator-rated MVA. Similarly, to obtain the underexcitation limiter per-unit characteristics in the P-Q plane, the specified values are divided by the generator-rated MVA.

Figures 6A, 6B:
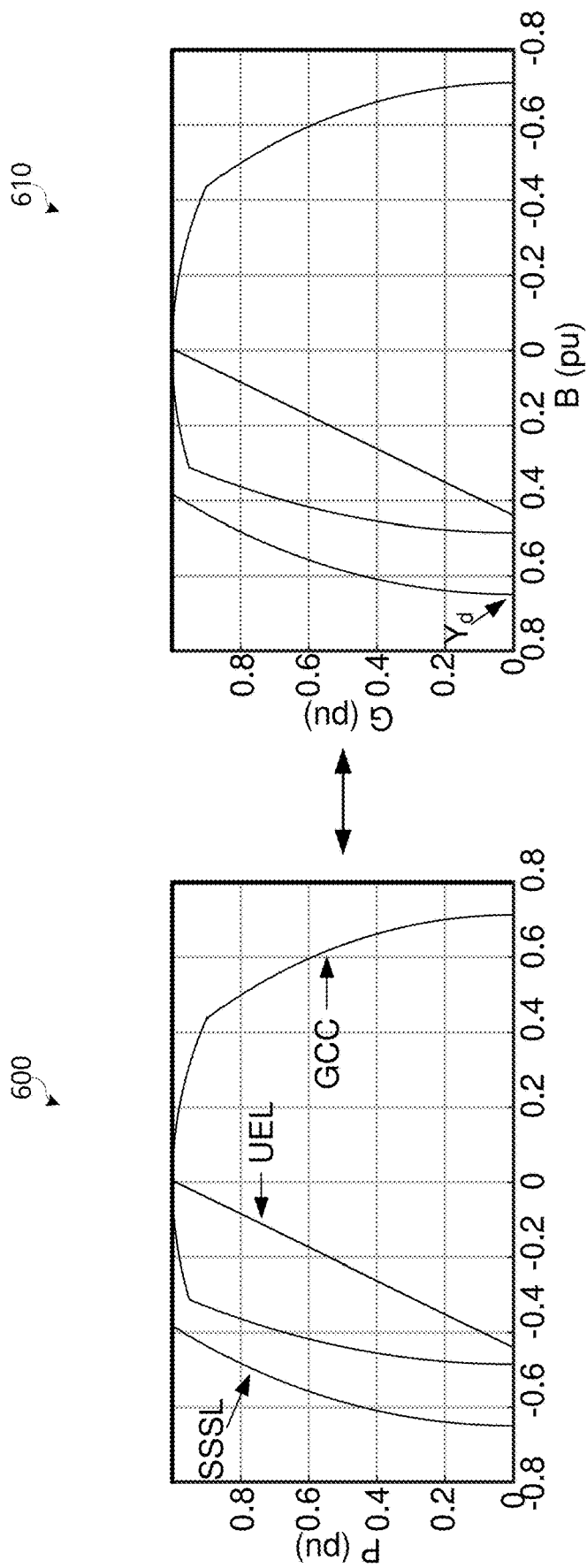
FIG. 6A illustrates a generator capability curve with an underexcitation limiter in the per-unit P-Q plane.
FIG. 6B illustrates the generator capability curve with the underexcitation limiter in the per-unit admittance plane.

FIG. 6A illustrates a plot 600 of the generator capability curve and underexcitation limiter per-unit characteristics in the P-Q plane for an example generator. The example plot 600 corresponds to a generator with an internal impedance value $X_d$ of approximately 1.54 per-unit and a system impedance value $X_S$ of approximately 0.298 per-unit. Accordingly, the underexcited region is on the left-hand side of the plot 600. The corresponding characteristics in the per-unit admittance plane Y can be calculated using Equation 4 below.

$$Y = \frac{S^*}{V_T^2} * Z_{BASE} = G + jB \qquad \text{Equation 4}$$

As before, $V_T$ represents the terminal voltage in kV. S is the complex power in MVA, such that S* is the complex conjugate of the complex power in MVA. $Z_{BASE}$ is the base impedance of the generator in Ohms. G is the conductance in per-unit and B is the susceptance in per-unit.

FIG. 6B illustrates a plot 610 of the same characteristics of FIG. 6A plotted on the per-unit admittance plane. In the per-unit admittance plane, the values of the susceptance, B, increases toward the left of the horizontal axis. The per-unit value of the direct-axis synchronous admittance, Yd, is inversely proportional to the internal impedance $X_d$, or approximately 0.65 per-unit in the illustrated embodiment.

Equation 5 can be used to identify the corresponding characteristics in the per-unit impedance plane as follows:

$$Z = \frac{V_T^2}{S^* * Z_{BASE}} = R + jX \qquad \text{Equation 5}$$

In Equation 5, R is the resistance in per-unit, and X is the reactance in per-unit. The steady-state stability limit characteristic in the impedance plane for an ideal lossless system with a generator connected to a power system is a circle determined according to Equation 6 below:

$$Z_{SSSL}(\alpha) = \left(\frac{1}{X_d} + \frac{1}{X_s}\right) * e^{j\alpha} + j\left(\frac{1}{X_d} + \frac{1}{X_s}\right) \qquad \text{Equation 6}$$

Figure 7:
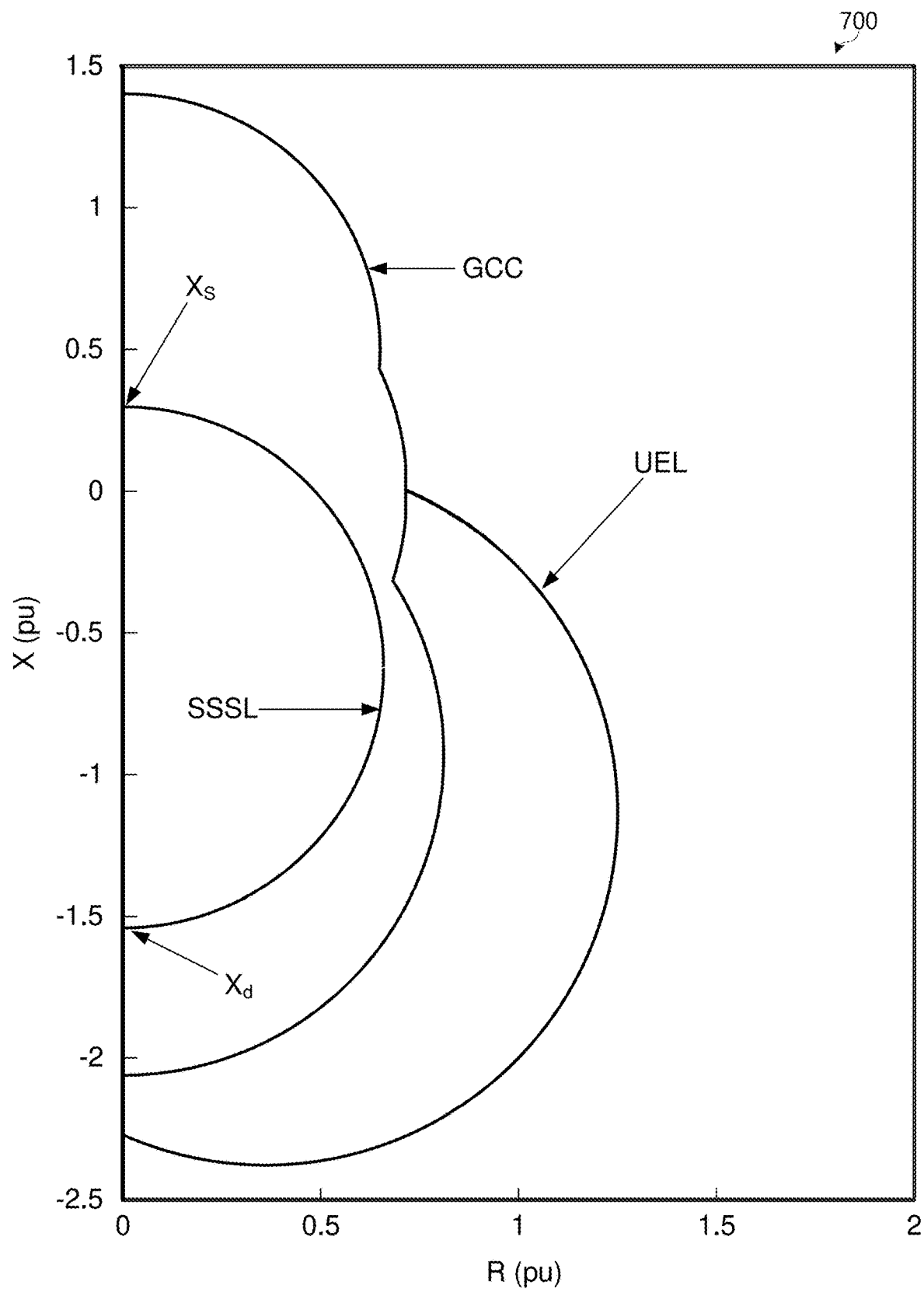
FIG. 7 illustrates a generator capability curve with an underexcitation limiter and a steady-state stability limit in the per-unit impedance plane corresponding to the curves illustrated in FIGS. 6A and 6B.

FIG. 7 illustrates a generator capability curve 700 with an underexcitation limiter and a steady-state stability limit in the per-unit impedance plane corresponding to the graphs in FIGS. 6A and 6B, according to various embodiments.

In some embodiments, loss-of-field protection systems may utilize impedance-based elements to respond to the apparent impedance. Prior to a loss-of-field condition, the apparent impedance looking toward the generator is defined by the loading of the generator. The apparent impedance is approximately equal to the internal impedance $X_d$ (415, FIG. 4) for a complete loss of field. In some embodiments, dual-zone impedance-based protection schemes may be utilized to prevent the apparent impedance from encroaching into the impedance element during operating conditions that do not involve loss of field.

Figure 8B:
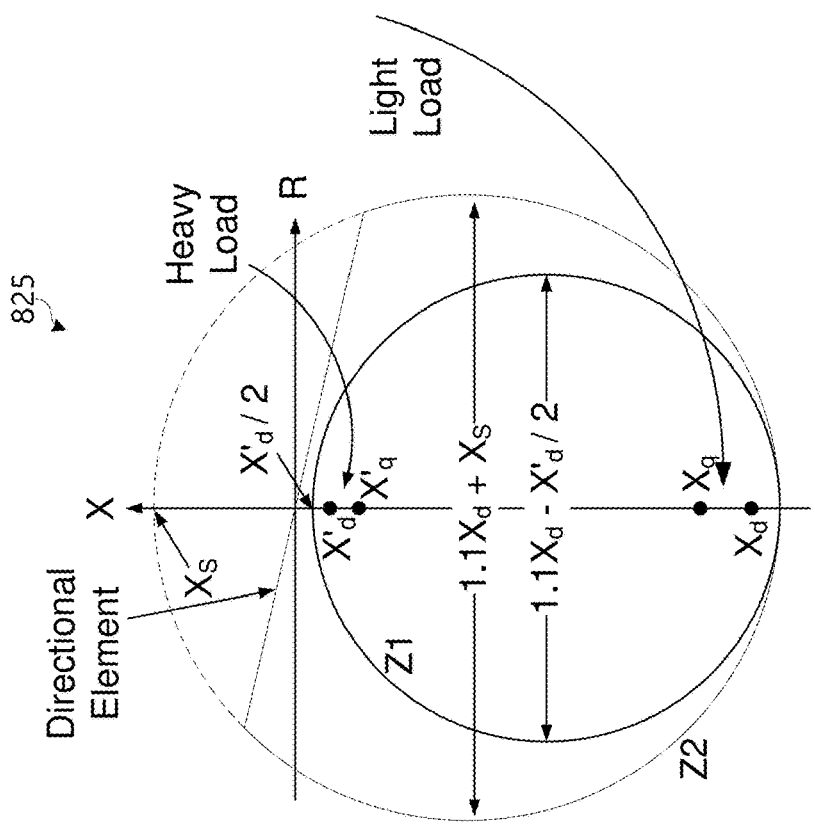
FIG. 8B illustrates a second impedance-based loss-of-field protection scheme.
Figure 8A:
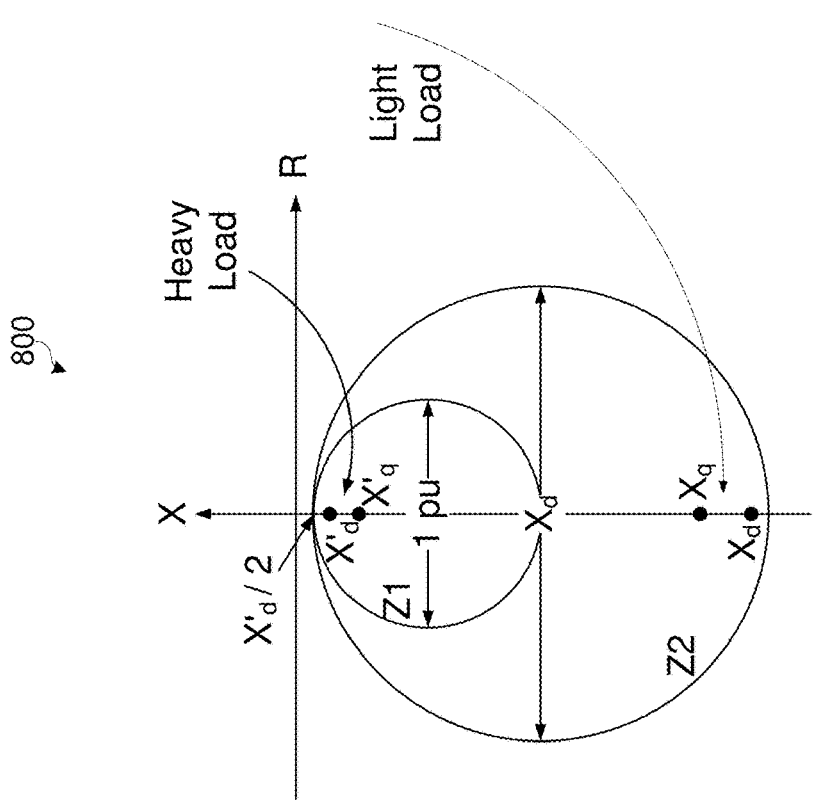
FIG. 8A illustrates a first impedance-based loss-of-field protection scheme.

FIGS. 8A and 8B illustrate protection schemes 800 and 825 for impedance-based protection and dual-zone impedance-based protection schemes, respectively. Each of the illustrated embodiments shows basic settings for impedance offsets and diameters, in conformance with IEEE Standard C37.102.

Specifically, FIG. 8A illustrates the zone 1 element intended to provide fast clearing for a loss of field at heavy load (e.g., six cycles). The reduced coverage for zone 1 provides security for stable power swings. The zone 2 (Z2) element is intended to detect a loss of field at light load. The greater coverage for this zone makes it more susceptible to power swings, and therefore provides slower clearing for a loss of field (e.g., 30 to 45 cycles).

FIG. 8B illustrates the zone 1 element intended to provide fast clearing for a loss of field at heavy load, similar to FIG. 8A. However, in the illustrated embodiments, the zone 1 element may be set with slightly slower clearing speeds (e.g., 15 cycles). The zone 2 protection system may include an impedance element, a directional element, and an undervoltage element. The zone 2 element may have a longer delay (e.g., 10-60 seconds). Tripping of the zone 2 protection system may be accelerated (e.g., to 12 to 18 cycles) if the undervoltage element picks up. The undervoltage element pickup may, for example, be set at 0.8 to 0.87 per unit.

In other embodiments, admittance-based loss-of-field protection systems may be utilized. The operation of admittance-based protection systems may be configured similarly to the impedance-based protection systems since admittance is the multiplicative inverse of impedance. The operating characteristics of loss-of-field admittance elements generally rely on straight-line characteristics in the admittance plane. Each characteristic can be defined by a susceptance value and a slope. The admittance scheme may utilize two zones, similar to the description of the impedance-based protection scheme.

In various embodiments, zone 1 is coordinated with the theoretical dynamic stability limit. This limit is derived from a solution of the two-axis, synchronous generator model in the transient state. Theoretical dynamic stability limit is related to the concept of dynamic stability in further consideration of the behavior of the generator controls.

Figure 9:
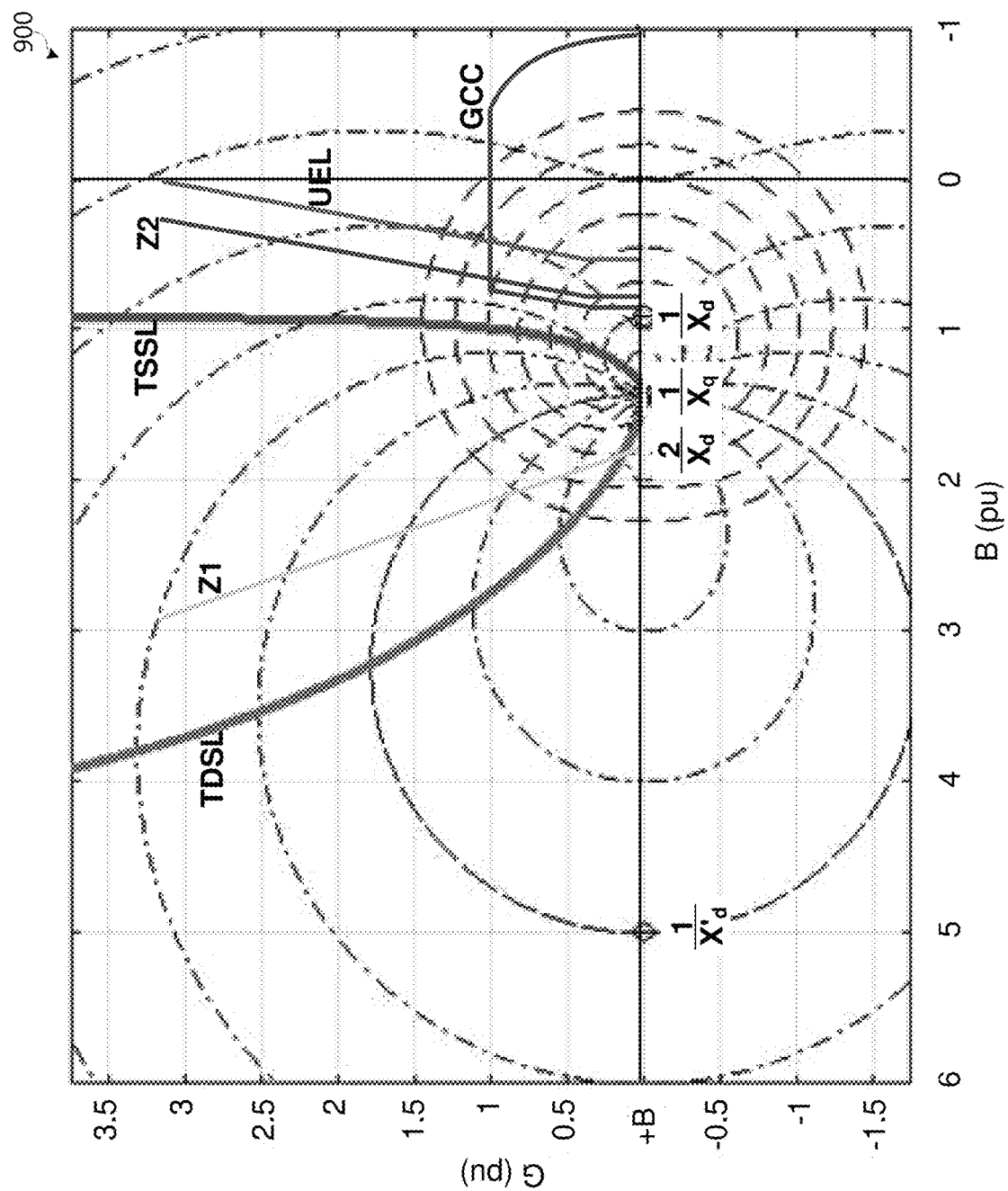
FIG. 9 illustrates coordination of the admittance scheme with a theoretical steady-state stability limit.

FIG. 9 illustrates a graphical depiction 900 of a protection schema with coordination of the admittance scheme and a theoretical steady-state stability limit, according to one embodiment. As illustrated, the theoretical dynamic stability limit originates on the B axis at $1/X_q$ and is asymptotic to $1/X'_d$. Setting guidelines recommend a B setting of $2/X_d$ and a slope of 110° with a suggested delay of less than 0.3 s.

Zone 2 is coordinated with the theoretical steady-state stability limit when $X_S=0$. For cylindrical-rotor generators, this limit is a vertical line at $1/X_d$. For salient-pole generators, this limit originates on the B axis at $1/X_q$ and is asymptotic to $1/X_d$. Zone 2 comprises two characteristics. For cylindrical-rotor generators, the basic setting guidelines call for the first characteristic to have a B setting of $1/X_d$ and a slope of 80° and the second characteristic to have a B setting of $0.9/X_d$ and a slope of 90°. For salient-pole generators, the basic setting guidelines call for the first characteristic to have a B setting of $1/X_d$ and a slope of 100° and the second characteristic to have a B setting of $1/X_d+(1/X_q-1/X_d)/2$ and a slope of 90°. The delay is set to approximately 10 seconds, but tripping is accelerated to 0.5-1.5 seconds for any detection of low field voltage.

In FIG. 9, Z1 and Z2 are plotted for $X_d=1.1$, $X_q=0.7$, and $X'_d=0.2$. The dashed lines are solutions to the general synchronous generator equations in the synchronous state for constant field current ($I_{FD}$). The theoretical steady-state limit connects the maxima of these lines. The dot-dashed lines are solutions to the general synchronous generator equations in the transient state ($X_d$ is replaced with $X'_d$) for constant field current. The theoretical dynamic stability limit connects the maxima of these lines.

Figure 10:
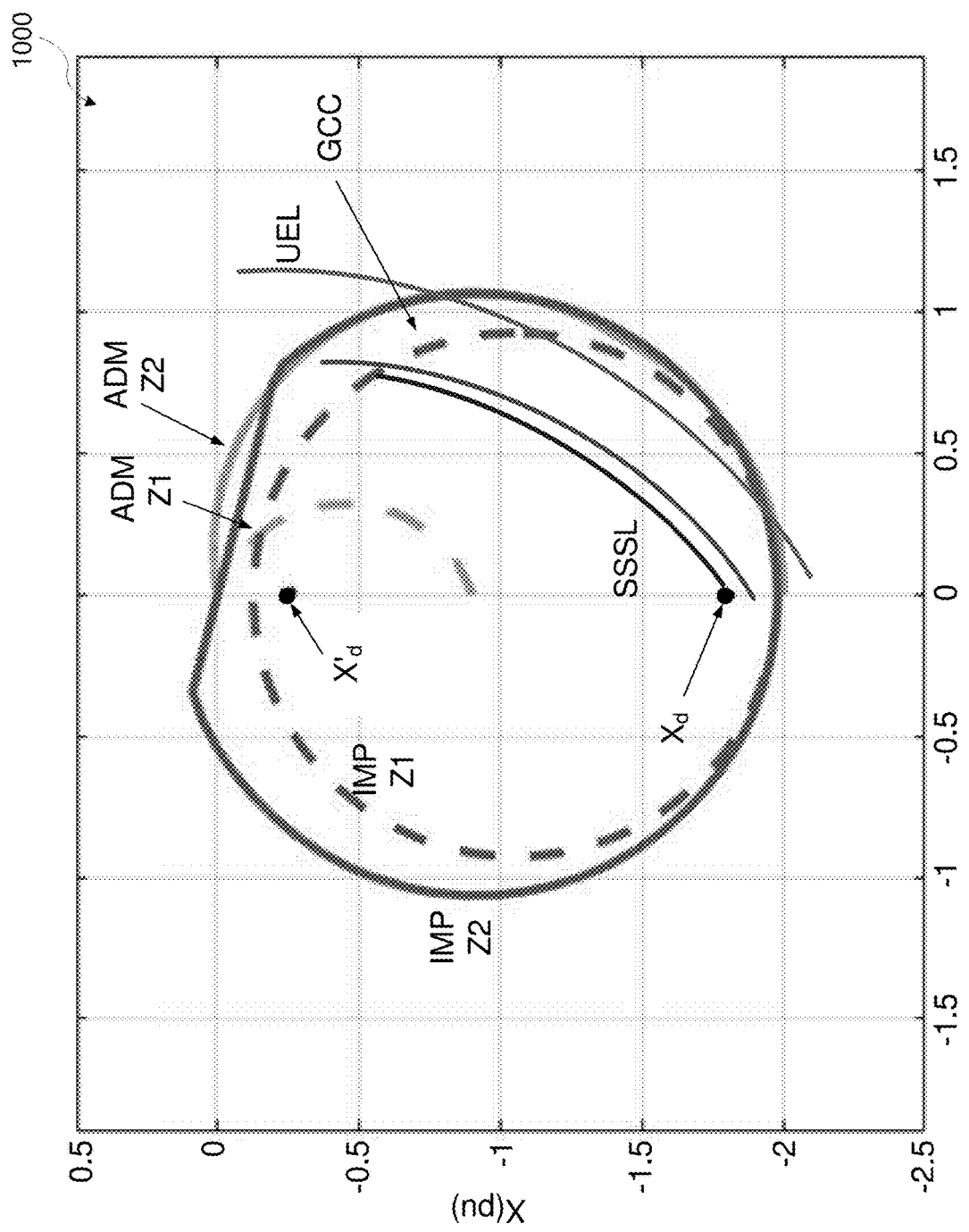
FIG. 10 illustrates a comparison of coverage of one embodiment of admittance and impedance schemes.

FIG. 10 illustrates a comparison 1000 of coverage of one embodiment of admittance and impedance schemes for a cylindrical-rotor generator with $X'_d=0.25$ per-unit, $X_d=1.8$ per-unit, and $X_S=0.15$ per-unit. For a complete loss-of-field condition, the apparent impedance ends up between $X_d$ and $X'_d$ and all loss-of-field schemes operate.

The protection coverage for each of the above-described protection schemes differs in one or more ways. For example, impedance scheme 2 zone 1 (IMP Z1) in FIG. 10 provides more coverage than admittance zone 1 (ADM Z1) but is likely to be more susceptible to operation during stable power swings. The dynamic behavior of the various protection elements in each protection scheme may also be a function of the supervising elements and/or customized time delays.

IEEE Standard C37.102 requires coordination between the loss-of-field scheme and the steady-state stability limit, the generator capability curve, and the underexcitation limiter curve. For the impedance schemes, coordination entails mapping of these curves from the P-Q plane to the impedance plane. For scheme 2, the basic zone 2 forward and reverse reach settings may be configured to ensure that the protection element coordinates with the steady-state stability limit, which is also a function of $X_d$ and $X_S$. Similarly, the basic setting guidelines for the admittance scheme ensure coordination with theoretical stability limits.

Numerous variations of the previously described embodiments have been adapted from the IEEE guidelines, and each of them provides different advantages and benefits. However, none of the preceding embodiments provides a loss-of-field protection scheme that is (1) based on the generator capability curve and defined in the P-Q plane for uniform and consistent visualization of the protection limits.

Figure 11:
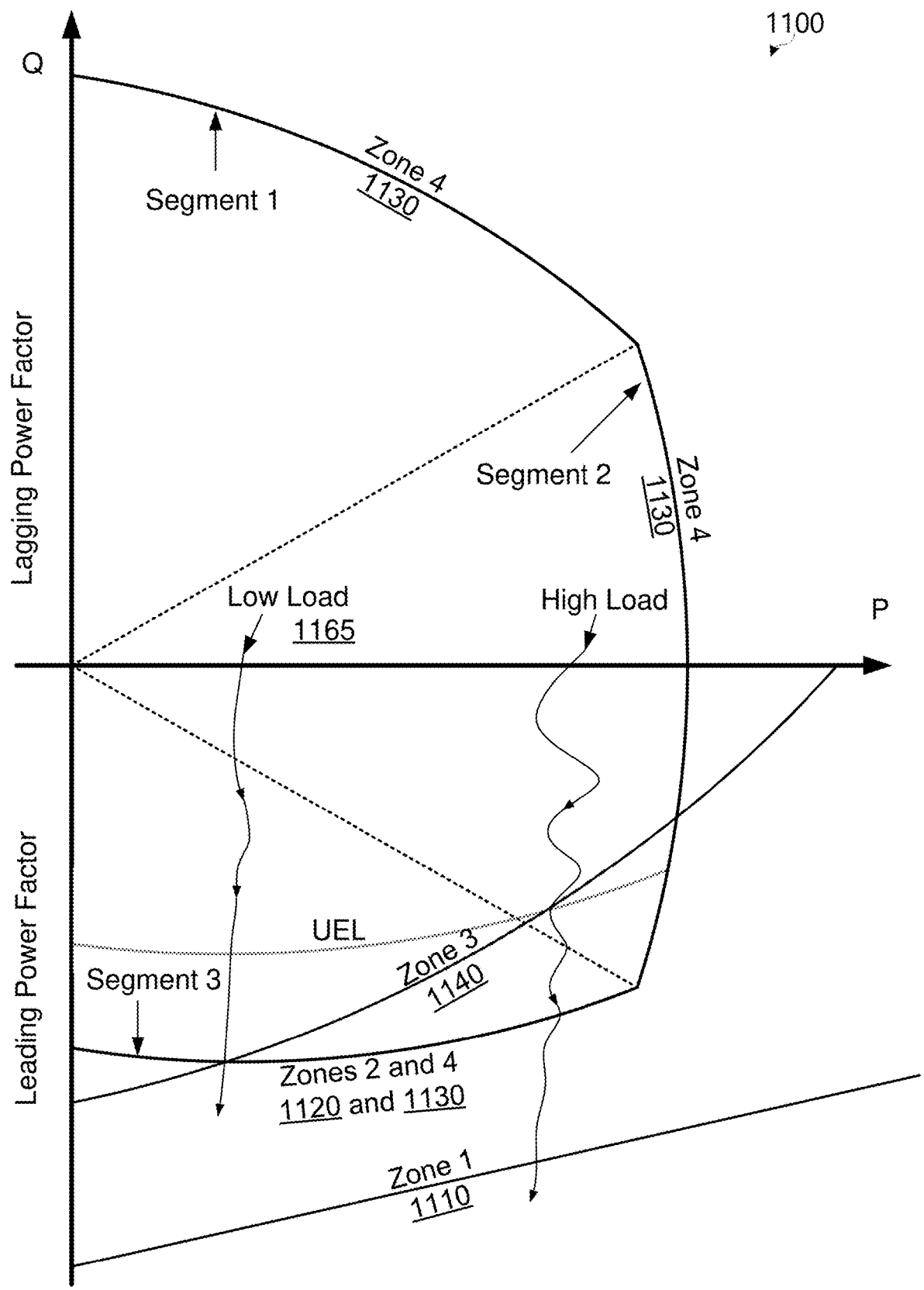
FIG. 11 illustrates a loss-of-field protection scheme that is different from the previously-described impedance-based loss-of-field protection schemes.

FIG. 11 illustrates a graph of a P-Q plane 1100 showing a four-zone, P-Q plane, loss-of-field protection scheme that is different from the previously described loss-of-field protection schemes, according to one embodiment. The illustrated protection scheme comprises four zones 1110, 1120, 1130, 1140 of protection, each of which is defined within the P-Q plane. Three zones correspond to loss of field protection and the fourth zone corresponds to a generator capability curve (GCC) alarm zone. The GCC alarm function uses the three segments identified as Segment 1, Segment 2, and Segment 3 to replicate (or closely approximate) a specific generator capability curve.

The protection scheme comprises three different algorithms to generate each of the three segments. In one embodiment, an algorithm fits one curve for each segment of the GCC. Furthermore, Segment 3 is modeled using a piece-wise-linear curve fitting to accommodate various generator capability curves with either straight-line or circular characteristics. In another embodiment, Segment 3 is modeled using quadratic curve fitting to accommodate the various generator capability curves. P and Q coordinates are used to define each segment within the P-Q plane.

Figure 12:
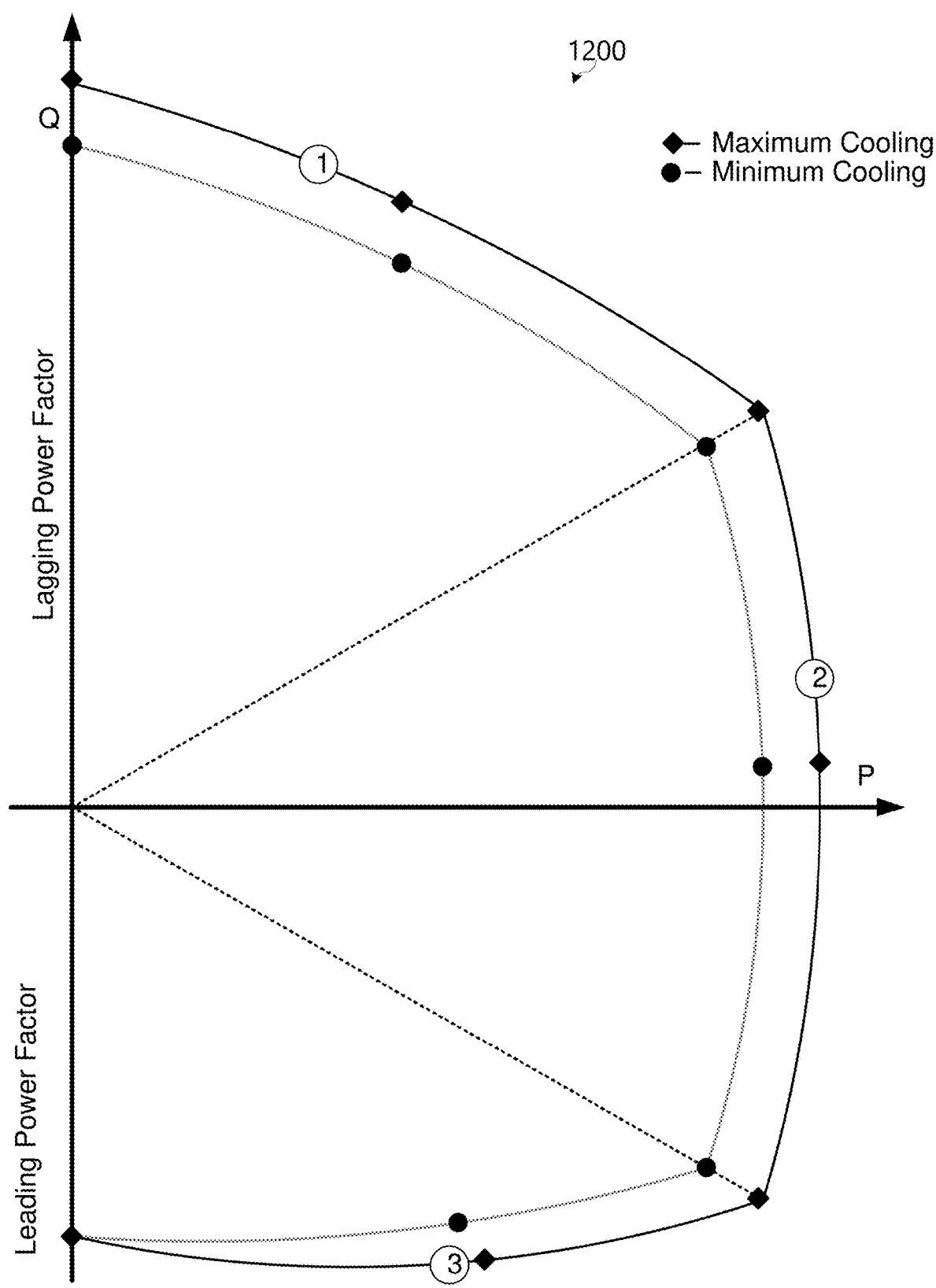
FIG. 12 illustrates an adjustable loss-of-field protection scheme that can be adjusted based on the available cooling capacity.

FIG. 12 illustrates protection curves 1200 for a generator with minimum cooling capabilities and maximum cooling capabilities. As previously described, the generator capability curves of many generators expand and contract according to the cooling level of the generator. In one embodiment, the algorithms of the generator protection system contract and expand the protection curves based on an analog measurement of the real-time cooling capability of the generator.

When a loss-of-field condition occurs on a strong power system, the power system supplies the generator with reactive power. If the generator is heavily loaded prior to the loss-of-field condition, the generator draws a large amount of reactive power from the system. This condition could impact the stability of the generator as the generator transitions from synchronous to asynchronous operation. Returning to FIG. 11, zone 1 1110 is defined in the P-Q plane 1100 as a straight line even though it operates in the admittance plane.

The operating point may move quickly into zone 1 1110 for various loading conditions. Zone 1 1110 may operate quickly for severe loss-of-field events (e.g., an open circuit in the field winding) to quickly prevent drawing large amounts of reactive power from the power system and avoid generator damage. Severe loss-of-field events include any of a wide variety of events that cause the generator to experience a loss-of-field at a relatively heavy load (e.g., more than 50% load) in a relatively short period of time (e.g., a few cycles or less). The zone 1 1110 characteristic and delay can be set following the loss-of-field element practice. For example, the zone 1 1110 time delay setting may be set short enough to prevent damage for a loss of field at full load, but long enough to avoid a trip for stable power swings.

Zone 2 1120 operates for loss-of-field events at low loads 1165. The protection element associated with zone 2 provides loss of field and thermal protection during underexcited operation. Specifically, an underexcitation limiter may govern the underexcited operation of the generator. Any of a wide variety of underexcitation limiter characteristics may be utilized, as previously described and modeled in other loss-of-field protection systems. In the P-Q plane, the underexcitation limiter shifts proportionally to $V_T^k$, where k can have a value of either 0, 1, or 2.

For instance, the IEEE underexcitation limiter 1 (UEL1) characteristic is a circle that changes according to $V_T^2$ (i.e., k=2). The IEEE UEL2C characteristic may be a single straight line in some embodiments, or a multi-segmented characteristic in other embodiments.

The protective element for zone 2 1120 is based on an underexcitation limiter characteristic. In some embodiments, the protective element for zone 2 1120 includes a "k" setting to coordinate with the underexcitation limiter. Furthermore, the protective element for zone 2 1120 may adapt to changes in the cooling capability of the generator element. For example, the protective element for zone 2 1120 may adjust the operational limits based on an analog measurement of cooling capability, an analog measurement of a real time temperature, and/or a digital input. In some embodiments, the underexcitation limiter itself may support temperature monitoring and/or cooling capacity monitoring.

In various embodiments, the delay in tripping the protective element for zone 2 1120 is set short enough to prevent damage for a loss-of-field condition at low loads 1165, but long enough to avoid tripping for stable power swings. As a specific example, a delay setting in the range of 1 to 60 seconds may be used, depending on the capacity and capabilities of the generator and the associated power system.

Similar to the embodiments described in the context of the impedance-based protection systems above, a protective element for zone 2 1120 can be set to have an accelerated trip during field or terminal undervoltage conditions. For example, a delay in the range of 0.25 seconds to 0.5 seconds may be used during undervoltage conditions (e.g., $V_T<0.8$ per-unit). Detailed power system studies (e.g., simulations, calculations, live testing, and/or combinations thereof) may be used to determine fine-tuned delay settings that provide adequate protection while preventing operation during stable power swings.

In weak power systems, the steady-state stability limit could encroach into the generator capability curve. For proper coordination, the protective element associated with zone 3 1140 may be set to replicate (or closely approximate) the steady-state stability limit characteristic and is set per Equation 7 below:

$$Z4_{pu} = \text{Re}\left[\left((P+jQ) - \frac{j3*V_T^2}{X_s}\right) * \left(\frac{-j3*V_T^2}{X_d} - (P+jQ)\right)^*\right] \quad \text{Equation 7}$$

In Equation 7, $X_d$ and $X_S$ are settings as previously described. The characteristics of zone 3 1140 are defined as a circular segment in the P-Q plane bounded within the fourth quadrant. According to various embodiments, the protective element for zone 3 1140 is implemented in the P-Q plane but operates in the admittance plane.

In some embodiments, an automatic voltage regulator may implement an underexcitation limiter based on Equation 7. The protective element for zone 3 1140 may be configured to move in synchronism with the steady-state stability limit to maintain coordination even while $V_T$ changes.

According to various embodiments, zone 3 1140 picks up and alarms when the operating point is within a threshold range or crosses the steady-state stability limit. In some embodiments, zone 3 1140 picks up and issues a trip command after a short delay if (1) the automatic voltage regulator operates in manual mode or (2) $V_T$ drops below 0.8 per-unit.

Tripping and/or alarming of the protective element for zone 3 1140 may be supervised by the status of the automatic voltage regulator. Specifically, the protective element for zone 3 1140 may be supervised by an indication from the automatic voltage regulator that the automatic voltage regulator is in manual mode. Alternatively, the protective element for zone 3 1140 may be supervised by an indication of an actual loss of steady-state stability with a significant undervoltage condition (e.g., $V_T<0.8$ per-unit). Accordingly, the protective element for zone 3 may include a dedicated undervoltage supervision element to accelerate tripping regardless of automatic voltage regulator operating mode (e.g., less than 0.25 seconds to avoid a pole slip).

In one embodiment, the protective element associated with zone 2 1120 may be coordinated with the steady-state stability limit. In another embodiment, the protective element associated with zone 3 1140 is dedicated to coordinate with the steady-state stability limit and the protective element associated with zone 2 1120 may be dedicated to coordinate with the underexcitation limiter.

A protective element associated with zone 4 1130 provides an alarm when the generator is operated close to the generator capability curve limits. In various embodiments, the protective element associated with zone 4 1130 does not trip the generator. Accordingly, in some embodiments, the delay for the zone 4 protective element may be set in the range of 1-10 seconds to minimize the occurrence of spurious assertions.

Segment 3 of zone 4 1130 can be set between the underexcitation limiter and zone 2 1120 to issue an alarm before the operating point reaches the limits of zone 2 1120. Segment 3 of zone 4 1130 dynamically coordinates with the underexcitation limiter and zone 2 1120 based on the k setting. In various embodiments, the characteristics of zone 4 1130 may be adjusted based on the cooling capability of the generator, as described in conjunction with the other protection elements.

Figure 13:
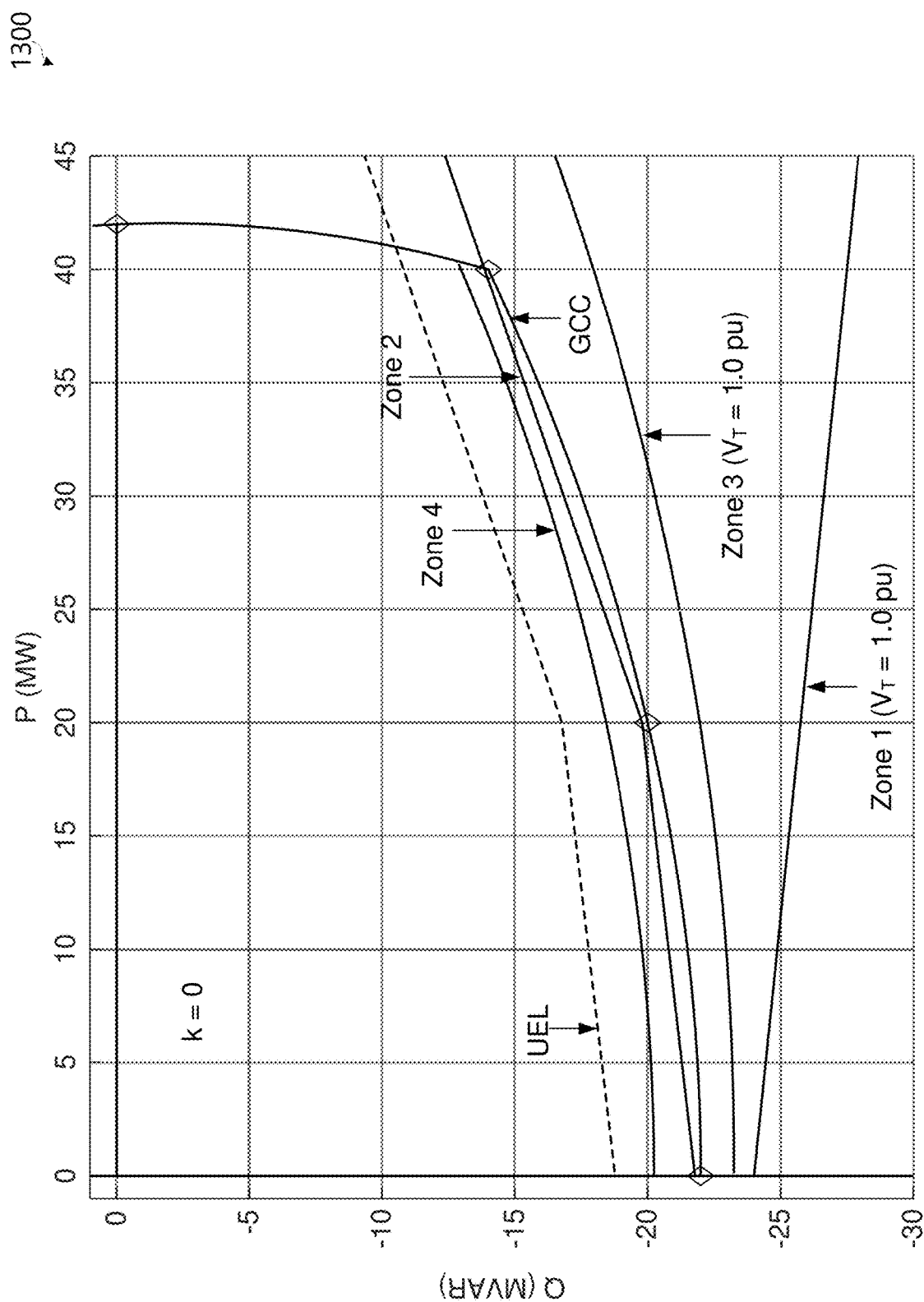
FIG. 13 illustrates an example embodiment of coordinated loss-of-field elements with k=0.

FIG. 13 illustrates an example embodiment 1300 of coordinated loss-of-field elements for zone 2 and zone 4 (1120 and 1130, FIG. 11) with k=0, according to various embodiments. In the illustrated embodiment, the underexcitation limiter is independent of $V_T$ (i.e., k=0). In the illustrated embodiment, the underexcitation limiter may be configured with a 10-percent margin with respect to the generator capability curve, zone 2 may be set to mirror the boundary of Segment 3 of the generator capability curve, and zone 4 may be set with a 5-percent margin with respect to the generator capability curve. For k=0, the underexcitation limiter, the protective element for zone 2, and the protective element for zone 4 are static in the P-Q plane. The protective element for zone 3 varies in proportion to $V_T^2$.

Figure 14:
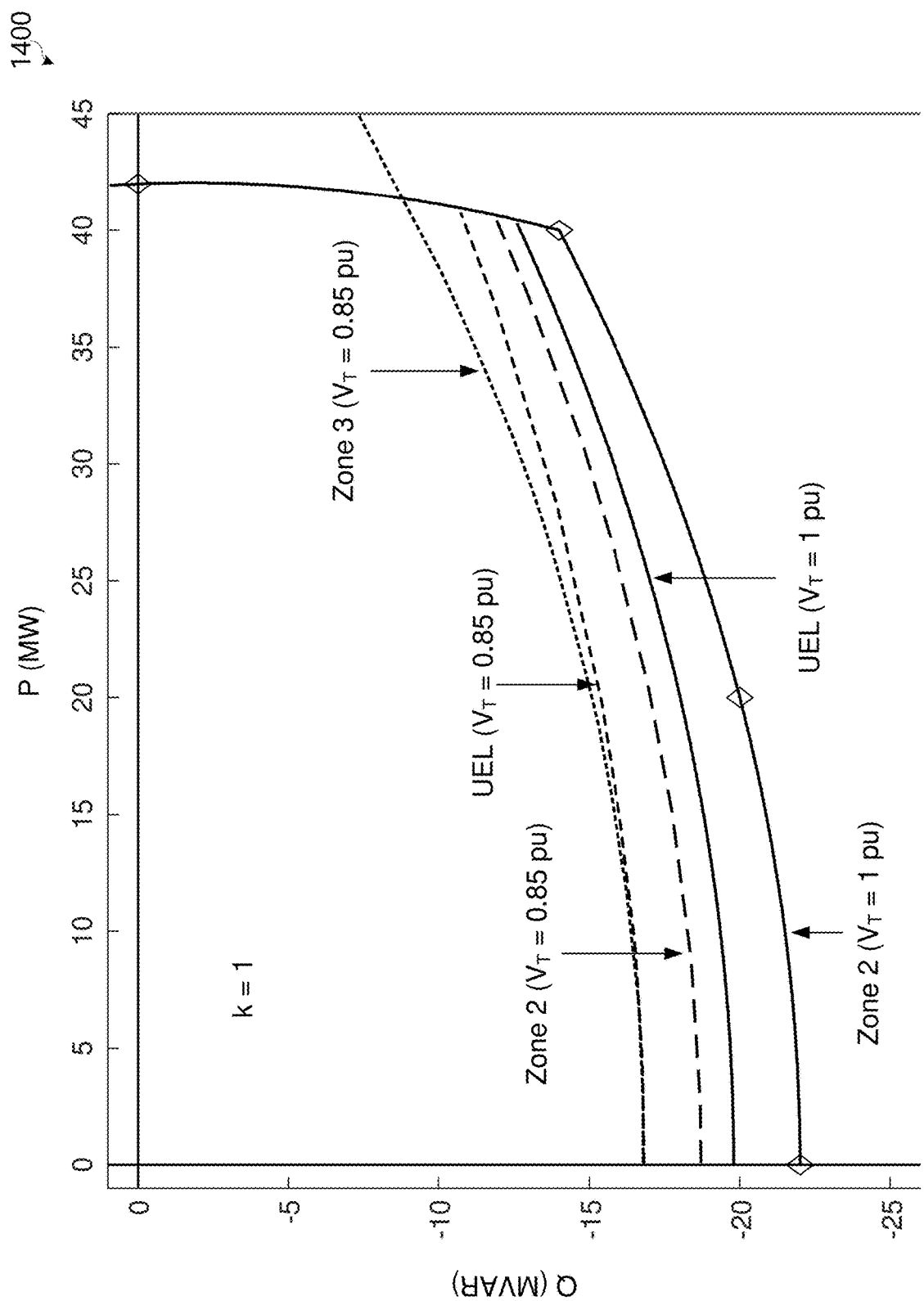
FIG. 14 illustrates an example embodiment of coordinated loss-of-field elements with k=1.

FIG. 14 illustrates an example embodiment 1400 of coordinated loss-of-field elements of zone 2 (1120, FIG. 11) and the underexcitation limiter with k=1, according to various embodiments. The underexcitation limiter is dependent on $V_T$ (i.e., k=1). The illustrated embodiment shows the underexcitation limiter and the protective element for zone 2 for both $V_T$=1 and $V_T$=0.85 per-unit. Zone 3 is shown with $V_T$=0.85 per-unit. As previously described, the protective element for zone 2 is shifted in synchronism with the underexcitation limiter.

The protective element for zone 3 times out and issues a trip command to prevent the generator from slipping poles when (1) $V_T$<0.8 per-unit, (2) the operating point is inside zone 3, and (3) the automatic voltage regulator fails to correct the low voltage condition. With this approach, schemes with k=0 or k=1 accelerate tripping during severe undervoltage conditions (e.g., $V_T$<0.8 per-unit) via the protective element associated with zone 3.

Figure 15:
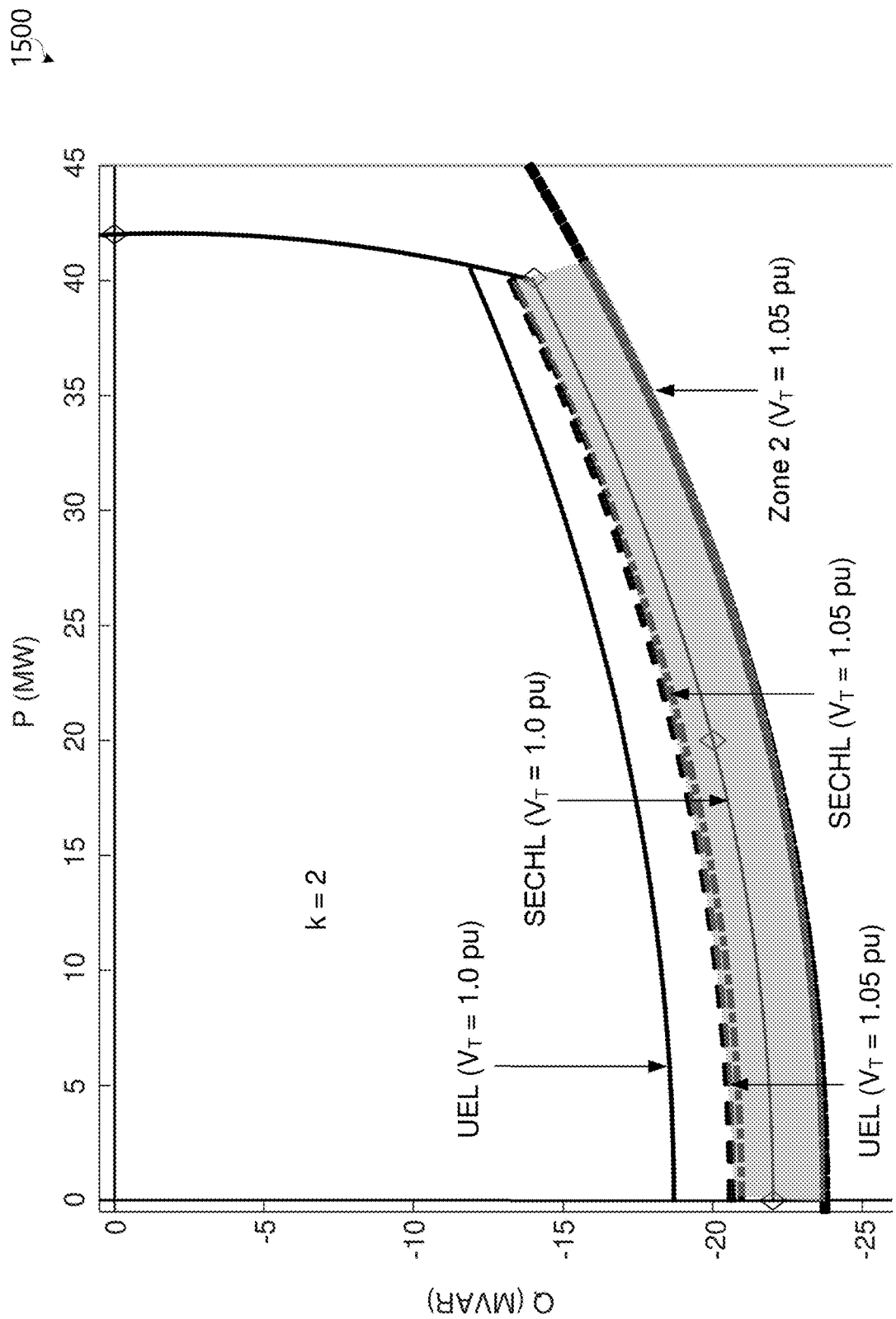
FIG. 15 illustrates an example embodiment of coordinated loss-of-field elements with k=2.

FIG. 15 illustrates an example embodiment 1500 of coordinated loss-of-field elements with k=2, according to one embodiment. In the illustrated embodiment, the underexcitation limiter depends on $V_T^2$ (i.e., k=2). The stator end-core heating limits may vary per Equations 1 and 2 above. To avoid spurious tripping, the underexcitation limiter can be set above the stator end-core heating limit (e.g., with $V_T$=1.05 per-unit) for proper coordination when k=2. In various embodiments, the margin between the underexcitation limiter and the generator capability curve may be set within 15-20 percent of $V_T$=1.0 per-unit.

The protective element for zone 2 may be set to 95 percent of the generator capability curve to protect the generator when 1.0 per-unit<$V_T$≤1.05 per-unit. In other embodiments, the protective element for zone 2 is set to 100 percent generator capability curve, but it will not provide protection for the generator when 1.0 per-unit<$V_T$≤1.05 per-unit (see the highlighted portion in FIG. 15). Accordingly, setting the protective element for zone 2 to 95 percent of the generator capability curve (according to data provided by the manufacturer) provides protection for end-core heating during overvoltage conditions, but it decreases the operating capability of the generator for rated voltage.

The "four-zone, P-Q plane, loss-of-field protection scheme" described in conjunction with FIGS. 11-15 provides multiple advantages as compared to the previously described impedance-based and admittance-based protection schemes. For example, the four-zone, P-Q plane, loss-of-field protection scheme provides better protection without sacrificing the benefits of legacy protection schemes. The uniform visualization of the scheme characteristics in the P-Q plane simplifies the setting process and provides assurance that the scheme is properly configured. All zones may be set in the P-Q plane using the generator capability curve and data set.

Moreover, the four-zone, P-Q plane, loss-of-field protection scheme operates the protective elements for zone 1 and zone 3 in the admittance plane and accounts for changes in $V_T$. The protective elements for zone 2 and segment 3 of zone 4 coordinate with the underexcitation limiter via the "k" corresponding settings. Zone 2 trip may be accelerated during severe loss-of-field conditions accompanied by undervoltage (e.g. $V_T$<0.8 per-unit). The protective element of zone 3 issues an alarm when the operating point approaches or crosses a steady-state stability limit and a trip signal may be issued during undervoltage conditions (e.g. $V_T$<0.8 per-unit).

Additionally, protective elements for zone 2 and zone 3 can be configured with accelerated tripping during severe loss-of-field conditions that are accompanied by undervoltage ($V_T$<0.8 per unit). The protective element for zone 3 can also trip with a short delay when an automatic voltage regulator operates in manual mode. Studies in the admittance plane (e.g., simulations, field testing, and/or calculations) can be used to fine-tune the delay settings for zone 1 and zone 2 (when k=2).

Figure 16:
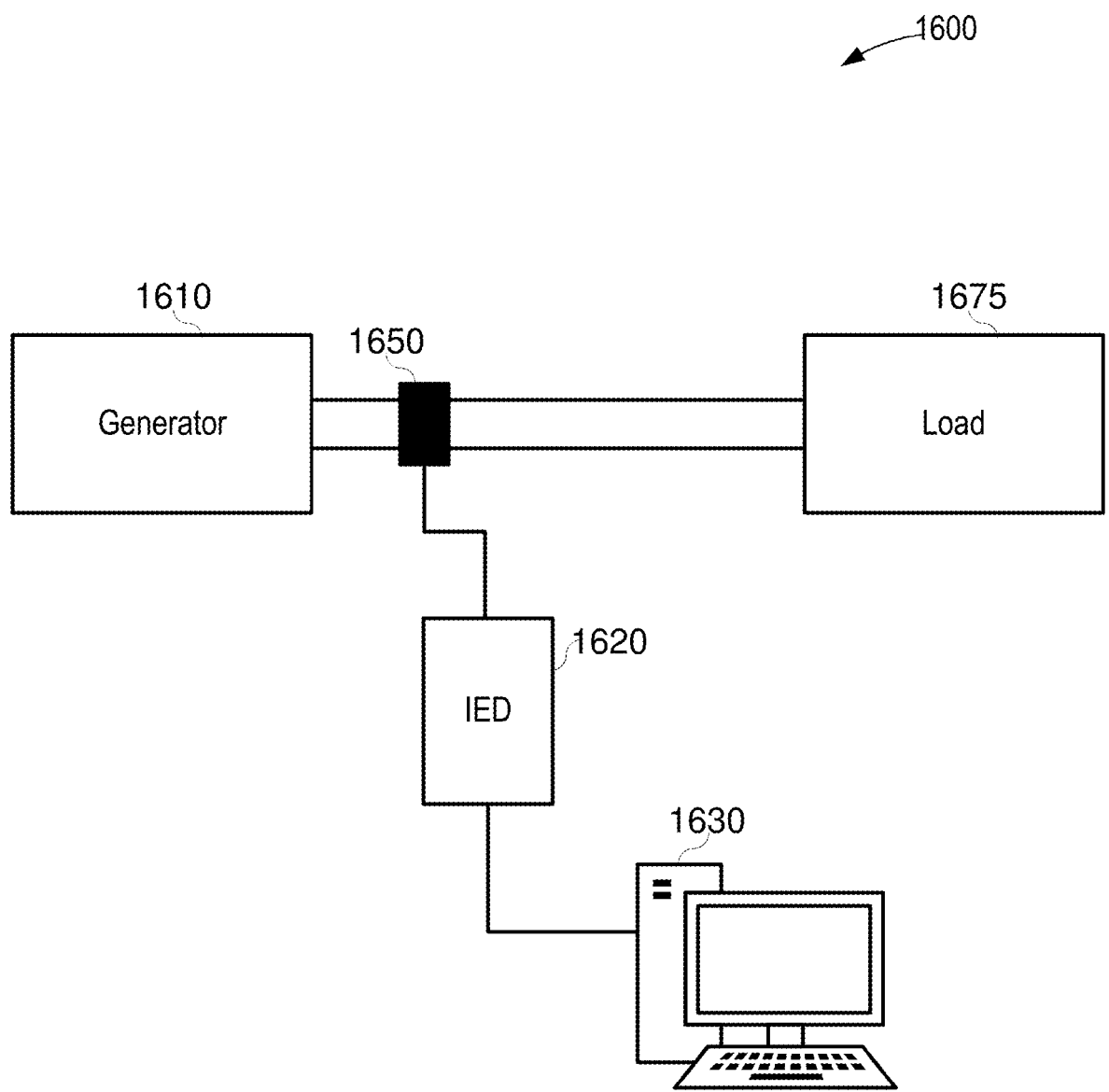
FIG. 16 illustrates a generator protection system implementing any of the various protection schemes described herein.

FIG. 16 illustrates a generator protection system 1600 implementing any of the various protection schemes described herein, according to one embodiment. A generator 1610, such as a synchronous generator, is connected to a load 1675. An IED 1620 may be programmed or otherwise configured via terminal 1630 to monitor and/or protect the generator 1610 from loss of field. For example, the IED 1620 may implement any combination of the protection and alarm schemes described in conjunction with FIGS. 11-15.

The presently described systems and methods can be adapted for use with any of a wide variety of generators and power systems operating at various frequencies and under various conditions. While specific embodiments and applications of the disclosure are described above, it is understood that the disclosure is not limited to the precise configurations and components disclosed herein. For example, the systems and methods described herein may be applied to an industrial electric power delivery system or an electric power delivery system implemented on a boat or oil platform. Accordingly, many changes may be made to the details of the above-described embodiments without departing from the underlying principles of this disclosure.

Any methods disclosed herein include one or more steps or actions for performing the described method. The method steps and/or actions may be interchanged with one another. In other words, unless a specific order of steps or actions is required for proper operation of the embodiment, the order and/or use of specific steps and/or actions may be modified and/or steps or actions may be omitted.

In some cases, well-known features, structures, or operations are not shown or described in detail. Furthermore, the described features, structures, or operations may be combined in any suitable manner in one or more embodiments. It will also be readily understood that the components of the embodiments as generally described and illustrated in the figures herein could be arranged and designed in a wide variety of different configurations. Thus, all feasible permutations and combinations of embodiments are contemplated.

In the description above, various features are sometimes grouped together in a single embodiment, figure, or description thereof for the purpose of streamlining the disclosure. This method of disclosure, however, is not to be interpreted as reflecting an intention that any claim requires more features than those expressly recited in that claim. Rather, as the following claims reflect, inventive aspects lie in a combination of fewer than all features of any single foregoing disclosed embodiment. Thus, the claims are hereby expressly incorporated into this Detailed Description, with each claim standing on its own as a separate embodiment. This disclosure includes all permutations and combinations of the independent claims with their dependent claims.

It will be apparent to those having skill in the art that changes may be made to the details of the above-described embodiments without departing from the underlying principles of the invention. Embodiments of the invention in which an exclusive property or privilege is claimed are defined as follows.

What is claimed is:

1. A system to provide loss-of-field protection for a synchronous generator, comprising:
an intelligent electronic device (IED) with a processor and instructions stored on a computer-readable medium that, when executed by the processor, cause the system to:
adjust loss-of-field protection settings associated with a first zone of protection in a P-Q plane to prevent damage to the generator from a loss-of-field event at full load by implementing a first protective action within a number of cycles between approximately 3 and 15 cycles;
adjust loss-of-field protection settings associated with a second zone of protection in the P-Q plane to prevent damage to the generator for a loss-of-field event at a light load;
adjust steady-state stability limit protection settings associated with a third zone of protection in the P-Q plane to limit operation of the generator to within a steady-state stability limit of the generator; and
adjust alarm settings associated with a fourth zone of protection in the P-Q plane to provide an alarm prior to a protective action relating to a loss-of-field event at the light load.

2. The system of claim 1, wherein the instructions, when executed by the processor, are further configured to adjust protection settings in the P-Q plane to trigger thermal overload during underexcited operation of the generator.

3. The system of claim 1, wherein the instructions, when executed by the processor, are further configured to limit operation of the generator within a stator end-core heating limit.

4. The system of claim 1, wherein the instructions, when executed by the processor, are configured to:
adjust the steady-state stability limit protection settings to implement a second protective action within a number of seconds between approximately 1 and 60 seconds.

5. The system of claim 4, wherein the instructions, when executed by the processor, are further configured to adjust undervoltage protection settings to detect undervoltage, and
wherein the steady-state stability limit protection settings are configured to implement the second protective action within an accelerated number of cycles between approximately 15 and 30 cycles when an undervoltage is identified.

6. The system of claim 5, wherein an undervoltage is identified when a terminal voltage of the generator is measured to be less than a percentage of nominal voltage between approximately 80% and 87%.

7. The system of claim 1, wherein the steady-state stability limit is calculated as a function of the system impedance, $X_S$, and the generator impedance, $X_d$.

8. The system of claim 1, further comprising a thermal adjustment subsystem to modify operational limits based on a thermal characteristic.

9. The system of claim 8, wherein the thermal adjustment subsystem is configured to modify the operational limits based on at least one of:
(i) an analog measurement of a real time temperature, and
(ii) a digital input indicating an available cooling capacity of the generator.

10. The system of claim 1, wherein the instructions, when executed by the processor, are configured to adjust the loss-of-field protection settings proportionally with respect to a terminal voltage ($V_T$) of the generator raised to the power of k, ($V_T^k$), where k is an integer.

11. The system of claim 1, further comprising a tripping device to disconnect the generator from a load when operation of the generator exceeds the steady-state stability limit.

12. The system of claim 11, wherein the tripping device is configured to disconnect the generator when at least one of two conditions is satisfied, including:
(i) an automatic voltage regulator indicates operation in manual mode, and
(ii) a terminal voltage, $V_T$, of the generator drops below 80% of a nominal operational voltage.

13. The system of claim 11, wherein the tripping device is configured to disconnect the generator when both of two conditions are satisfied, including:
(i) an automatic voltage regulator indicates operation in manual mode, and
(ii) a terminal voltage, $V_T$, of the generator drops below 80% of a nominal operational voltage.

14. The system of claim 1, wherein each of the first, second, third, and fourth zones of protection and a generator capability curve of the generator are displayed as part of a graphical user interface in the P-Q plane to simplify system configuration.

15. The system of claim 1, further comprising a controller and memory to coordinate and supervise the first, second, third, and fourth protective elements.

16. A protective device to provide loss-of-field protection for a synchronous generator, comprising:
a processor;
a non-transitory computer-readable medium with instructions stored thereon that, when executed by the processor, cause the protective device to:
adjust loss-of-field protection settings associated with a first zone of protection in a P-Q plane to disconnect the generator in response to a loss-of-field event at full load within a number of cycles between approximately 3 and 15 cycles;
adjust steady-state stability limit protection settings associated with a second zone of protection in the P-Q plane to limit operation of the generator to within a steady-state stability limit of the generator; and
adjust underexcitation protection settings associated with a third zone of protection in the P-Q plane to limit operation of the generator within a stator end-core heating limit during underexcited operation of the generator.

17. The protective device of claim 16, wherein the instructions, when executed by the processor, are further configured to:
adjust loss-of-field protection settings associated with a fourth zone of protection in the P-Q plane to prevent damage to the generator for a loss-of-field event at a light load.

18. The protective device of claim 17, wherein the instructions, when executed by the processor, are further configured to:
adjust alarm settings associated with a fourth zone of protection in the P-Q plane to provide an alarm prior to a protective action relating to the loss-of-field event at the light load.

19. The protective device of claim 16, further comprising a tripping device to disconnect the generator from a load in response to operation of the generator exceeding the steady-state stability limit.

* * * * *